United States Patent
Kim et al.

(10) Patent No.: US 10,330,722 B2
(45) Date of Patent: Jun. 25, 2019

(54) PIPE STRUCTURE AND SEMICONDUCTOR MODULE TESTING EQUIPMENT INCLUDING THE SAME

(71) Applicant: SAMSUNG ELECTRONICS CO., LTD., Suwon-si, Gyeonggi-do (KR)

(72) Inventors: Min-woo Kim, Cheonan-si (KR); Yong-dae Ha, Asan-si (KR); Chang-ho Lee, Asan-si (KR); Seul-ki Han, Asan-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/670,379

(22) Filed: Aug. 7, 2017

(65) Prior Publication Data

US 2018/0106853 A1 Apr. 19, 2018

(30) Foreign Application Priority Data

Oct. 17, 2016 (KR) .................. 10-2016-0134546

(51) Int. Cl.
   *G01R 31/00* (2006.01)
   *G01R 31/26* (2014.01)
   *G01R 31/28* (2006.01)

(52) U.S. Cl.
   CPC ....... *G01R 31/2601* (2013.01); *G01R 31/003* (2013.01); *G01R 31/2607* (2013.01); *G01R 31/2637* (2013.01); *G01R 31/2874* (2013.01); *G01R 31/2891* (2013.01); *G01R 31/2642* (2013.01); *G01R 31/2886* (2013.01)

(58) Field of Classification Search
   CPC ............ G01R 31/2601; G01R 31/2891; G01R 31/2874; G01R 31/003; G01R 31/2607; G01R 31/2637; G01R 31/2642; G01R 31/2886
   USPC ..................................... 324/750.08; 165/908
   See application file for complete search history.

(56) References Cited

U.S. PATENT DOCUMENTS

| 5,889,651 A | * | 3/1999 | Sasaki | G01R 31/2891 |
| | | | | 165/908 |
| 7,061,760 B2 | | 6/2006 | Hornung et al. | |
| 7,451,053 B2 | | 11/2008 | Jeong | |
| 7,473,568 B2 | | 1/2009 | Co et al. | |
| 7,703,975 B2 | | 4/2010 | Kim | |

(Continued)

FOREIGN PATENT DOCUMENTS

| KR | 10-2007-0028178 | 3/2007 |
| KR | 10-0742291 | 7/2007 |

(Continued)

*Primary Examiner* — Farhana A Hoque
(74) *Attorney, Agent, or Firm* — F. Chau & Associates, LLC

(57) ABSTRACT

Semiconductor module testing equipment includes a test board, a plurality of pipe structures extending from an upper surface of the test board in a first direction and spaced apart from one another in a second direction that intersects the first direction, wherein the first and second directions are substantially parallel to a plane of the test board, at least one semiconductor module socket disposed between a pair of neighboring pipe structures of the plurality of pipe structures, and a plurality of nozzles disposed on each pipe structure of the plurality of pipe structures, wherein the plurality of nozzles is configured to discharge a fluid laterally.

20 Claims, 32 Drawing Sheets

(56) References Cited

U.S. PATENT DOCUMENTS

| | | | |
|---|---|---|---|
| 7,808,783 B2 | 10/2010 | Goth et al. | |
| 7,891,868 B2 | 2/2011 | Sohn | |
| 8,032,722 B2 | 10/2011 | Yoshida | |
| 8,102,651 B2 * | 1/2012 | Bland | G06F 1/20 361/694 |
| 8,767,403 B2 | 7/2014 | Rau et al. | |
| 9,236,121 B2 | 1/2016 | Lee et al. | |

FOREIGN PATENT DOCUMENTS

| | | |
|---|---|---|
| KR | 10-0766379 | 10/2007 |
| KR | 10-0772560 | 10/2007 |
| KR | 10-0861371 | 9/2008 |
| KR | 10-2015-0046812 | 5/2015 |

* cited by examiner

PIPE STRUCTURE AND SEMICONDUCTOR MODULE TESTING EQUIPMENT INCLUDING THE SAME

CROSS-REFERENCE TO RELATED APPLICATION

This application claims priority under 35 U.S.C. § 119 to Korean Patent Application No. 10-2016-0134546, filed on Oct. 17, 2016, in the Korean Intellectual Property Office, the disclosure of which is incorporated by reference herein in its entirety.

TECHNICAL FIELD

The inventive concept relates to testing equipment, and more particularly, to a pipe structure and a semiconductor module testing equipment including the same.

DISCUSSION OF THE RELATED ART

Testing equipment may be used for testing the high temperature performance and the low temperature performance of a manufactured semiconductor module. The testing of the high and low temperature performance of the semiconductor module may be a final operation of the manufacturing process of the semiconductor module. Typically, semiconductor module testing equipment is configured to heat air inside a chamber to a predetermined temperature by using a heater and a fan, to sense the temperature of the air inside the chamber by using a temperature sensor, and to control the heater and the fan to maintain the predetermined temperature.

To increase the efficiency and reliability of a testing operation, the temperature of the semiconductor module, which is disposed inside of the semiconductor module testing equipment to be tested, should be maintained close to a test reference temperature. However, when the semiconductor module also generates heat during the testing operation, it may be difficult to accurately and uniformly maintain the temperature distribution in the chamber.

SUMMARY

According to an exemplary embodiment of the inventive concept, semiconductor module testing equipment includes a test board, a plurality of pipe structures extending from an upper surface of the test board in a first direction and spaced apart from one another in a second direction that intersects the first direction, wherein the first and second directions are substantially parallel to a plane of the test board, at least one semiconductor module socket disposed between a pair of neighboring pipe structures of the plurality of pipe structures, and a plurality of nozzles disposed on each pipe structure of the plurality of pipe structures, wherein the plurality of nozzles is configured to discharge a fluid laterally.

According to an exemplary embodiment of the inventive concept, a pipe structure includes at least one nozzle array comprising a plurality of nozzles configured to discharge a fluid laterally. The pipe structure is disposed between a pair of neighboring semiconductor module sockets of a plurality of semiconductor module sockets, wherein the pair of neighboring semiconductor module sockets of the plurality of semiconductor module sockets is disposed on a test board and extends in a first direction, or wherein the pipe structure is disposed adjacent to a side of an outermost semiconductor module sockets of the plurality of semiconductor module sockets.

According to an exemplary embodiment of the inventive concept, semiconductor module testing equipment includes a board, a first semiconductor module disposed on the board, the first semiconductor module comprising a plurality of semiconductor stacks disposed on a first side of the first semiconductor module and arranged in a first direction, and a first pipe structure disposed on the board adjacent to the first side of the first semiconductor module, the first pipe structure extending in the first direction. The first pipe structure includes a plurality of holes. Each of the plurality of holes of the first pipe structure is configured to discharge a heating fluid or a cooling fluid toward the plurality of semiconductor stacks of the first side of the first semiconductor module to heat or cool the plurality of semiconductor stacks of the first side of the first semiconductor module.

BRIEF DESCRIPTION OF THE DRAWINGS

The inventive concept will become more apparent by describing in detail exemplary embodiments thereof in conjunction with the accompanying drawings, in which.

DETAILED DESCRIPTION OF THE EMBODIMENTS

Figure 1:
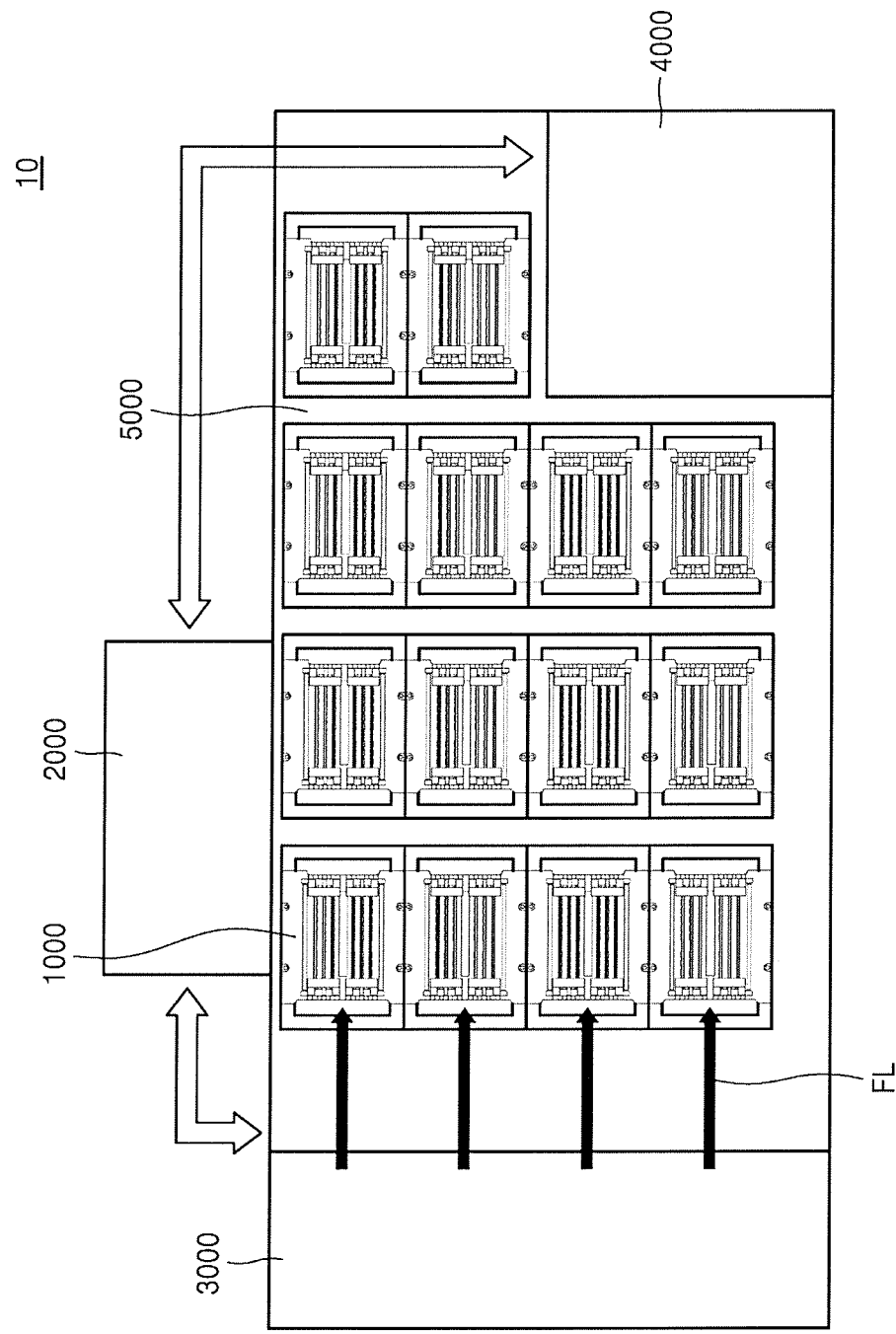
FIG. 1 is a schematic view illustrating a semiconductor module testing system including semiconductor module testing equipment according to an exemplary embodiment of the inventive concept.

Hereinafter, exemplary embodiments of the inventive concept will be described in detail with reference to the accompanying drawings. Like reference numerals may refer to like elements throughout the specification. A duplicate description of elements may be omitted for brevity. However, it should be understood that where an element is not described, the element may be understood to be similar to an identified corresponding element that is described elsewhere in the specification.

Figure 2:
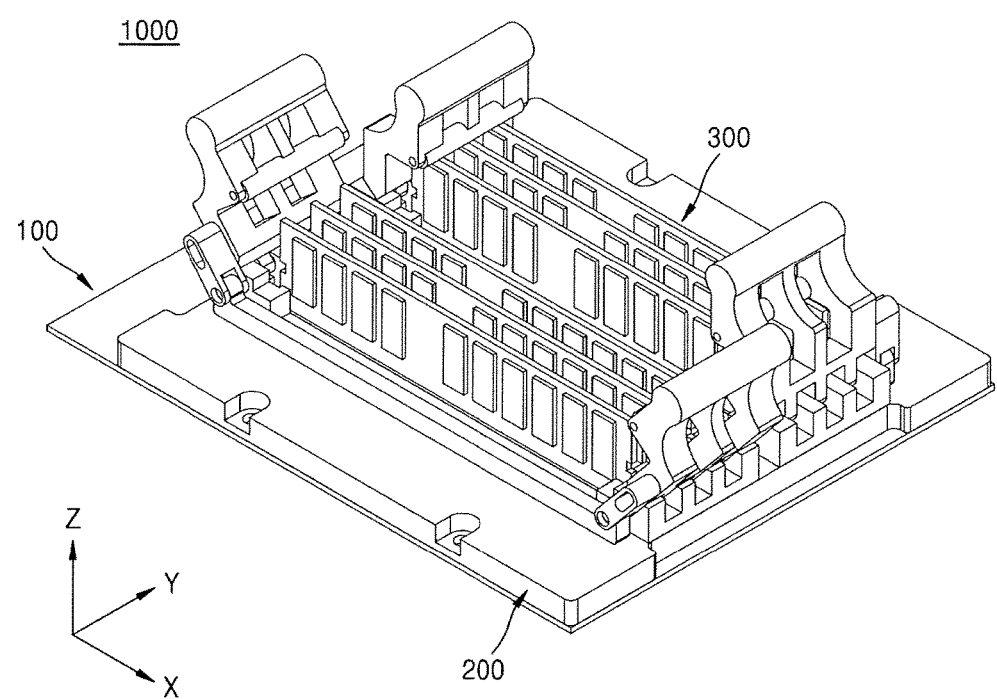
FIG. 2 is a perspective view illustrating the semiconductor module testing equipment of FIG. 1 according to an exemplary embodiment of the inventive concept.
Figure 3:
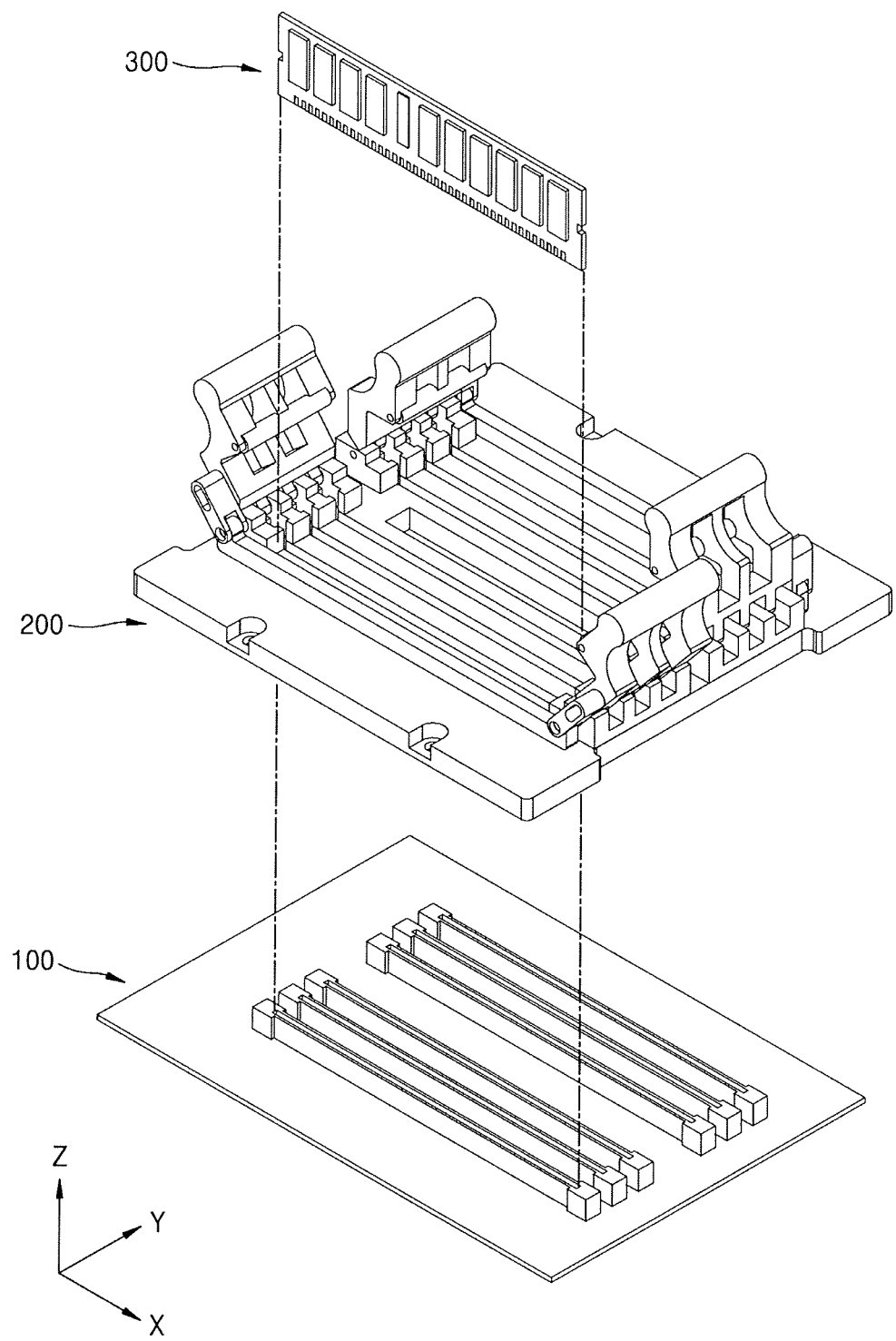
FIG. 3 is an exploded perspective view illustrating the semiconductor module testing equipment of FIG. 2, according to an exemplary embodiment of the inventive concept.

FIG. 1 is a schematic view illustrating a semiconductor module testing system 10 including semiconductor module testing equipment 1000 according to an exemplary embodiment of the inventive concept. FIG. 2 is a perspective view illustrating the semiconductor module testing equipment 1000 of FIG. 1 according to an exemplary embodiment of the inventive concept. The semiconductor module testing equipment 1000 shown in FIG. 2 may include a pipe structure. FIG. 3 is an exploded perspective view illustrating the semiconductor module testing equipment 1000 of FIG. 2, according to an exemplary embodiment of the inventive concept.

Referring to FIGS. 1 to 3, the semiconductor module testing system 10 may include the semiconductor module testing equipment 1000, a temperature controller 2000, a fluid supply channel 3000, a control interface 4000, and a testing equipment mounting unit 5000.

The semiconductor module testing equipment 1000 may include a test board 100 on which a plurality of semiconductor module sockets 120 (refer to FIG. 4) are disposed, and a top plate 200 disposed on the test board 100.

A plurality of temperature sensors may be used to measure the temperature of semiconductor stacks and/or the semiconductor module testing equipment 1000 in real-time. The plurality of temperature sensors may be disposed on the test board 100, included in the semiconductor module testing equipment 1000. Alternatively, a semiconductor module 300, which is to be tested by the semiconductor module testing equipment 1000, may include a semiconductor stack, and the semiconductor stack may include one or more temperature sensors. For example, the semiconductor stack may include a resistance temperature device (RTD).

The temperature controller 2000 may be used to control the fluid supply channel 3000 to increase or decrease the temperature of the semiconductor module testing equipment 1000 and the temperature of the semiconductor modules 300 to a target temperature. For example, the temperature controller 2000 may include circuitry that is configured to raise or lower the temperature of the semiconductor module testing equipment 1000 and the temperature of the semiconductor modules 300. The target temperature may be programmed (e.g., preset) in advance.

The temperature controller 2000 may be connected to a plurality of temperature sensors and may determine whether to cool or heat the semiconductor module testing equipment 1000 and semiconductor stacks 320 by comparing the temperature measured by the plurality of temperature sensors with the target temperature. Then, the temperature controller 2000 may drive the fluid supply channel 3000 and supply a cooling or a heating fluid FL to the semiconductor module testing equipment 1000. The cooling or the heating fluid FL, supplied from the fluid supply channel 3000, may be discharged toward each of the semiconductor stacks 320 (refer to FIG. 6) via nozzles nz (refer to FIG. 8A) connected to pipe structures 250 (refer to FIG. 6, e.g., pipe structures 250a, 250b, etc.).

The control interface 4000 may include a personal computer, a workstation/server computer, etc. The control interface 4000 may provide a test command for testing the performance of an operation of a device (e.g., a semiconductor device included in the semiconductor module 300) at a given temperature. The control interface 4000 may include testing software to control the temperature controller 2000, and the control interface 4000 may update and revise the testing software. Alternatively, the control interface 4000 may provide a command to the temperature controller 2000 depending on a test to be performed. Alternatively, the control interface 4000 may receive temperature data measured by the temperature sensor and store the temperature data.

The testing equipment mounting unit 5000 may be configured to support and connect components of the semiconductor module testing system 10. The testing equipment mounting unit 5000 may be configured to mount the semiconductor module testing equipment 1000. The testing equipment mounting unit 5000 may cover a side surface and a bottom portion of the semiconductor module testing equipment 1000 so that the semiconductor module testing equipment 1000, which is mounted on the testing equipment mounting unit 5000, is not exposed to external impurities or shocks. The testing equipment mounting unit 5000 may include a central processing unit (CPU) board, etc., for each piece of semiconductor module testing equipment 1000 to control each of the pieces of semiconductor module testing equipment 1000 separately. Referring to FIG. 1, it is illustrated that the testing equipment mounting unit 5000 mounts 14 pieces of semiconductor module testing equipment 1000. However, the number of semiconductor module testing equipment 1000 pieces is not limited thereto.

Figure 4:
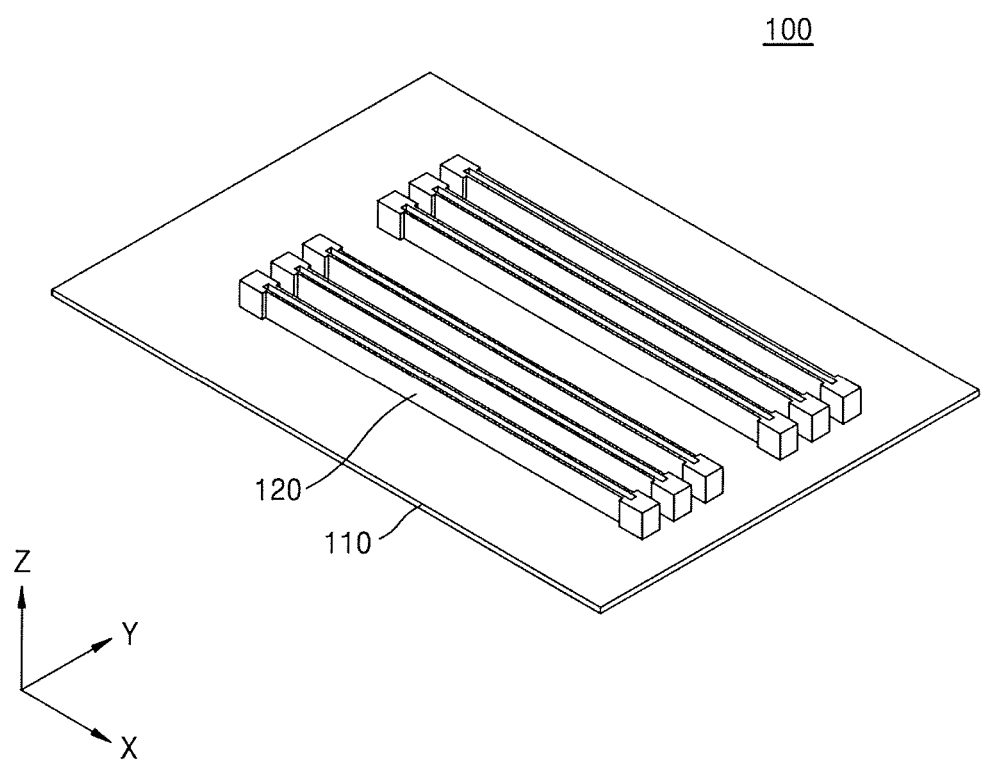
FIG. 4 is a perspective view illustrating a test board included in the semiconductor module testing equipment of FIG. 1, according to an exemplary embodiment of the inventive concept.

The semiconductor module testing equipment 1000 may include the test board 100. The test board 100 may include a plurality of semiconductor module sockets 120, as shown in FIG. 4. The top plate 200 may be provided on the test board 100 to protect the test board 100 from external impurities or shocks. The top plate 200 may be coupled to the test board 100 and may expose insertion portions of the semiconductor module sockets 120. The insertion portions of the semiconductor module sockets 120 may be inner spaces of the semiconductor module sockets 120. The semiconductor modules 300 may be inserted into the exposed insertion portions of the semiconductor module sockets 120.

Two directions that are parallel to the plane of the test board 100 and intersect each other are defined as a first direction (e.g., a direction X) and a second direction (e.g., a direction Y). A direction substantially perpendicular to the first and second directions (the directions X and Y) is defined as a third direction (e.g., a direction Z). For example, the first direction (the direction X) and the second direction (the direction Y) may intersect each other substantially perpendicularly. The first direction (the direction X) and the second direction (the direction Y) are directions that are substantially perpendicular to the third direction (the direction Z).

FIG. 4 is a perspective view illustrating a test board 100 included in the semiconductor module testing equipment 1000 of FIG. 1, according to an exemplary embodiment of the inventive concept.

The plurality of semiconductor module sockets 120 may be disposed on the test board 100 and may extend in the first direction (the direction X). The plurality of semiconductor module sockets 120 may be spaced apart from one another in the second direction (the direction Y). Circuits and components of the semiconductor module testing equipment 1000 (refer to FIG. 1) are mounted on the test board 100. The test board 100 may support the entire memory module testing equipment 1000 (refer to FIG. 1) so that the memory module testing equipment 1000 may operate stably.

The semiconductor module sockets 120 are devices formed on the test board 100 to mount semiconductor modules that are to be tested. A semiconductor module 300 (refer to FIG. 6), etc., may be inserted into the semiconductor module sockets 120 to be mounted on the test board 100. A plurality of pins may be formed in the semiconductor module sockets 120 to correspond to external connection terminals 330 (refer to FIG. 6) of the inserted semiconductor module 300.

Figure 5:
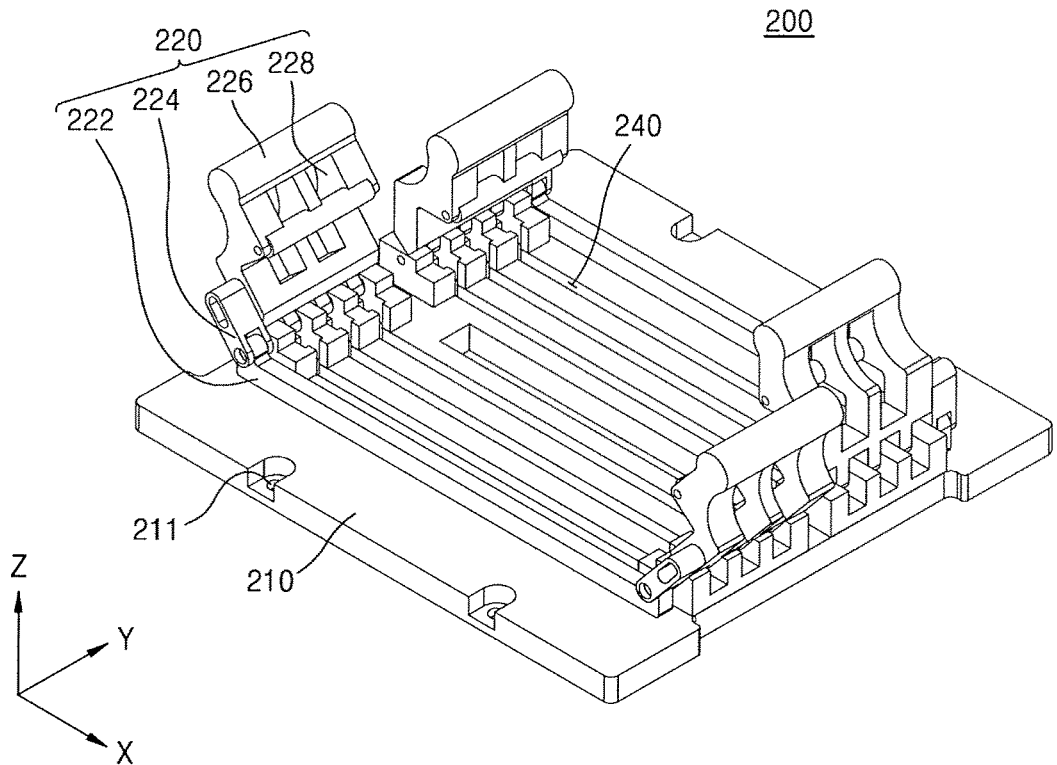
FIG. 5 is a perspective view illustrating a top plate which may be included in the semiconductor module testing equipment of FIG. 1, according to an exemplary embodiment of the inventive concept.

FIG. 5 is a perspective view illustrating a top plate 200 which may be included in the semiconductor module testing equipment 1000 of FIG. 1, according to an exemplary embodiment of the inventive concept.

Referring to FIG. 5, the top plate 200 may be coupled to the test board 100 on the test board 100 to protect the test board 100 from external shocks and impurities. A body portion 210 of the top plate 200 may include module coupling holes 240 through which the semiconductor modules 300 may be coupled to the semiconductor module sockets 120 (refer to FIG. 4) of the test board 100 (refer to FIG. 4). A plurality of coupling grooves 211 may be formed in the body portion 210 so that the top plate 200 is disposed on the test board 100 and stably coupled to the test board 100. The top plate 200 may include a plastic substrate, a semiconductor substrate, and/or a metal substrate. However, the top plate 200 is not limited thereto. Fixing handles 220 may be included at both ends of the body portion 210 in the first direction (the direction X). The fixing handle 220 may include a handle supporter 222, a handle arm 224, and a handle head 226. The handle supporter 222 may be configured to stably couple the fixing handle 220 with the top plate 200. The handle arm 224 may be coupled to the handle supporter 222, and may be connected to the handle supporter 222 such that the handle arm 224 may rotate backward and forward with respect to an end of the handle supporter 222. The handle head 226 may be coupled to an end of the handle arm 224, which is spaced apart from the handle supporter 222. The handle head 226 may be shifted via the handle arm 224 and may fix the semiconductor module 300 on the test board 100 after the top plate 200 and the semiconductor modules 300 are disposed on the test board 100. Accordingly, the semiconductor module 300 may be stably coupled to the top plate 200 and the semiconductor modules 300. The handle head 226 may include bridge portions 228. The bridge portions 228 may contact the semiconductor module 300 and support the semiconductor module 300 by pressing the semiconductor module 300.

Figure 6:
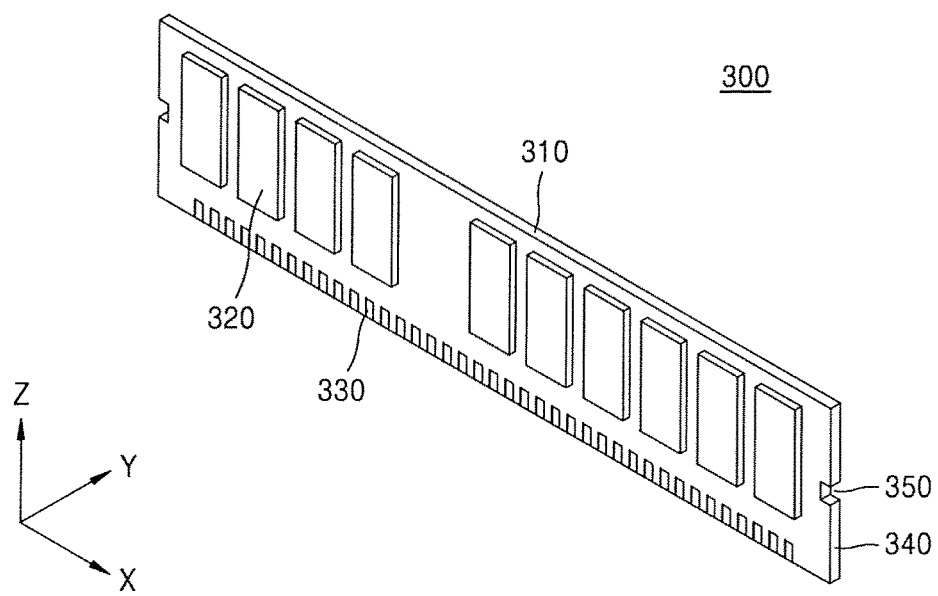
FIG. 6 is a perspective view illustrating a semiconductor module which may be included in the semiconductor module testing equipment of FIG. 1, according to an exemplary embodiment of the inventive concept.

FIG. 6 is a perspective view illustrating a semiconductor module 300 which may be included in the semiconductor module testing equipment 1000 of FIG. 1, according to an exemplary embodiment of the inventive concept. Referring to FIG. 6, the semiconductor module 300 may include a printed circuit board (PCB) 310 having a shape of a rectangular plate, and a plurality of semiconductor stacks 320 mounted on the PCB 310. A plurality of external connection terminals 330 are arranged at bottom portions of both surfaces of the PCB 310 in the first direction (the direction X) of the PCB 310. A socket slot portion 340, coupled to the semiconductor module socket 120 (refer to FIG. 2), may be formed at both ends of the PCB 310 in the first direction (the direction X). In addition, a hook insertion groove 350, through which the semiconductor module 300 and the semiconductor module socket 120 may be stably coupled to each other, may be formed in the middle of the socket slot portion 340.

The semiconductor modules 300 may include a plurality of memory modules. For example, the semiconductor modules 300 may include a dual in-line memory module (DIMM), a small outline DIMM (SO-DIMM), an unbuffered-DIMM, or a fully buffered DIMM (FB-DIMM).

The PCB 310 is a substrate on which the plurality of semiconductor stacks 320 are mounted, and may include a PCB card, a plastic substrate, and/or a semiconductor substrate having another structure. The PCB 310 may have a structure in which a plurality of metal wiring layers and a plurality of insulating layers are alternately stacked.

The plurality of semiconductor stacks 320 mounted on the PCB 310 may include semiconductor devices used in personal computers (PCs) or mobile devices. The semiconductor devices may include a non-volatile memory device which may electrically erase and program data, and may retain data even when power is interrupted. According to an exemplary embodiment of the inventive concept, a NAND-type flash memory, which is a non-volatile memory device and has a high capacity and a high speed storage capability, may be provided as the non-volatile memory device. Alternatively, the semiconductor devices may include phase-change random access memory (PRAM), magnetic random access memory (MRAM), resistance random access memory (ReRAM), ferroelectric random access memory (FRAM), NOR flash memory, etc. Also, the semiconductor devices may include a volatile memory device which loses data when power is interrupted, such as dynamic random access memory (DRAM), static random access memory (SRAM), etc.

In an exemplary embodiment of the inventive concept, the semiconductor module 300 may further include a register. The register may be a high speed exclusive area in which a small amount of data, or an intermediate result which is being processed, is temporarily stored. The register is used for a designated purpose as a memory device or a circuit retaining one bit or multiple bits and frequently accesses stored data. The register may include an accumulator, an arithmetic register, an instruction register, a shift register, an index register, etc.

The plurality of external connection terminals 330 are arranged in series at the bottom portions of the PCB 310 in the direction X, which is a lengthwise direction of the PCB 310. The external connection terminals 330 may be used as signal terminals. The signal terminals may include an address terminal to which address signals are input, a command terminal to which command signals are input, a clock terminal to which clock signals are input, and a data terminal to which data is input or output. According to an exemplary embodiment of the inventive concept, the external connection terminals 330 may include a pad, a pin, and/or a tab.

Figure 7:
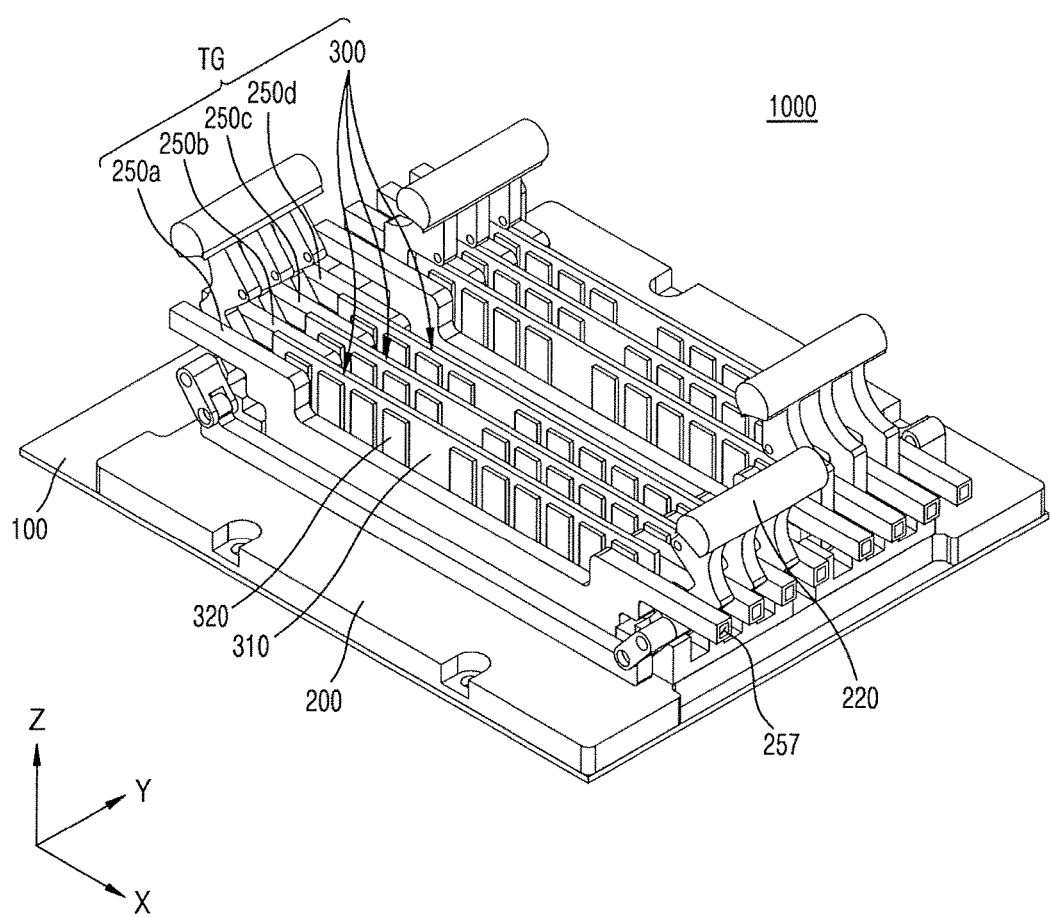
FIG. 7 is a perspective view illustrating the semiconductor module testing equipment of FIG. 1 according to an exemplary embodiment of the inventive concept.

FIG. 7 is a perspective view illustrating the semiconductor module testing equipment 1000 of FIG. 1 according to an exemplary embodiment of the inventive concept. The semiconductor module testing equipment 1000 includes pipe structures 250a, 250b, 250c, and 250d, according to an exemplary embodiment of the inventive concept. The pipe structures 250a, 250b, 250c, and 250d may extend in the first direction (the direction X) and may be spaced apart from one another in the second direction (the direction Y). The pipe structures 250a, 250b, 250c, and 250d may extend in parallel to the semiconductor module sockets 120. Alternatively, the pipe structures 250a, 250b, 250c, and 250d may extend in parallel to the semiconductor modules 300. The semiconductor module sockets 120 (refer to FIG. 4) may be arranged between two neighboring pipe structures 250a, 250b, 250c, and 250d. When the semiconductor modules 300, inserted into the semiconductor module sockets 120, are DIMMs, or the like, the semiconductor modules 300 include the semiconductor stacks 320 at both side surfaces thereof. For example, the semiconductor stacks 320 may be formed at both side surfaces of each of the semiconductor modules 300. Both side surfaces of each of the semiconductor modules 300 may be substantially parallel to an x-z plane in FIG. 7. Thus, the pipe structures 250a, 250b, 250c, and 250d may be disposed at both side surfaces of each of the semiconductor modules 300 to correspond to the semiconductor stacks 320 when the semiconductor stacks 320 are disposed on both side surfaces of the semiconductor modules 300.

Alternatively, two pipe structures of the pipe structures 250a, 250b, 250c, and 250d may be arranged at both sides of the semiconductor module sockets 120, with one pipe structure 250a, 250b, 250c, or 250d being disposed at each side surface of each of the semiconductor module sockets 120. In this case, two neighboring pipe structures 250a, 250b, 250c, and 250d are spaced apart from each other in the second direction (the direction Y) with a semiconductor module socket 120 disposed between the two neighboring pipe structures 250a, 250b, 250c, and 250d.

FIG. 7 illustrates that four pipe structures 250a, 250b, 250c, and 250d and three semiconductor modules 300 are included in one test group TG, and that two test groups TG are included in one piece of semiconductor module testing equipment 1000. However, this is illustrated only for convenience of description, and the structure of the semiconductor module testing equipment 1000 is not limited thereto. For example, two or more than four semiconductor modules 300 may be included in one test group TG, and one or more than three test groups TG may be included in one piece of semiconductor module testing equipment 1000. The pipe structures 250a, 250b, 250c, and 250d include inner spaces through which the fluid FL may move. A fluid insertion hole 257 may be formed at an end of the pipe structures 250a, 250b, 250c, and 250d in the first direction (the direction X). After the fluid FL, supplied from the fluid supply channel 3000, is distributed via a fluid distributor, the fluid FL may be provided to each of the pipe structures 250a, 250b, 250c, and 250d via fluid insertion holes 257A, 257B, and 257C (refer to FIG. 8). Then, the fluid FL, which may be a cooling or a heating fluid, may be discharged toward a memory module by nozzles nz. The nozzles nz may be connected to the inner spaces of the pipe structures 250a, 250b, 250c, and 250d.

Figure 8A:
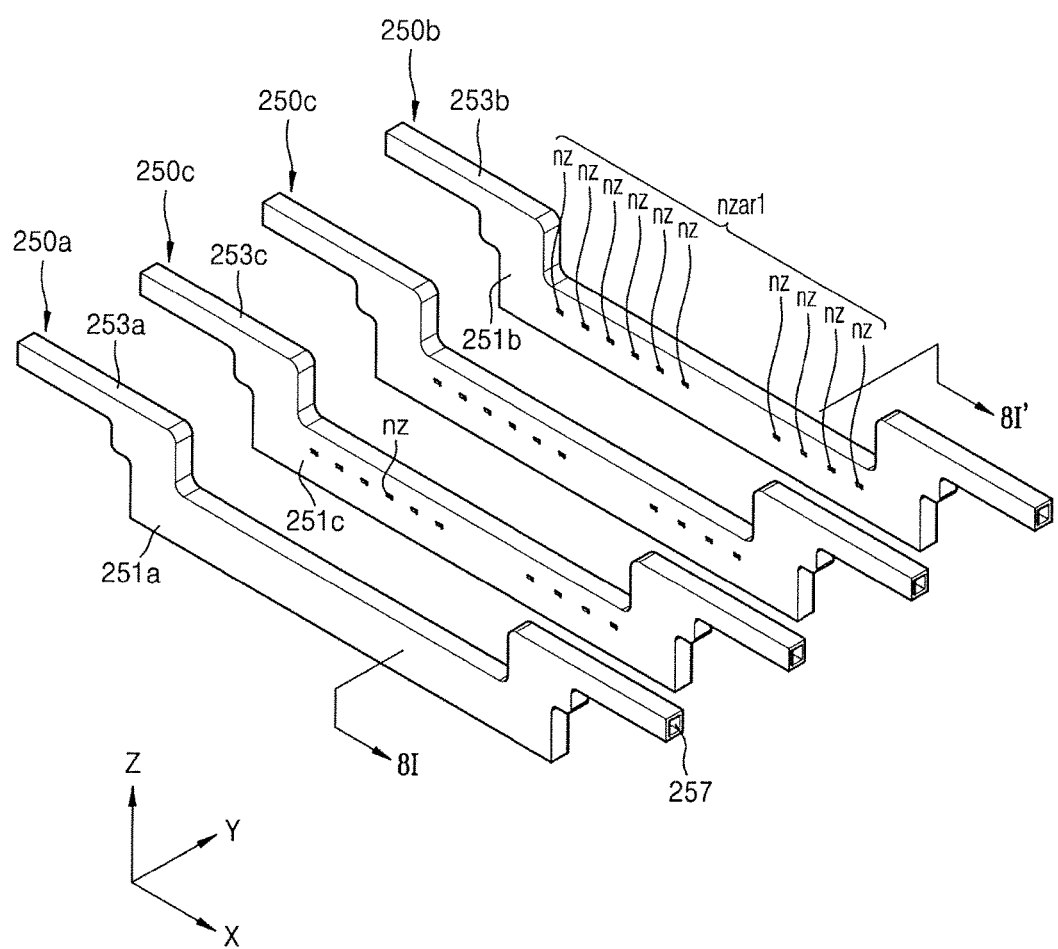
FIG. 8A is a perspective view illustrating pipe structures included in a test group of the semiconductor module testing equipment of FIG. 1, according to an exemplary embodiment of the inventive concept.
Figure 8B:
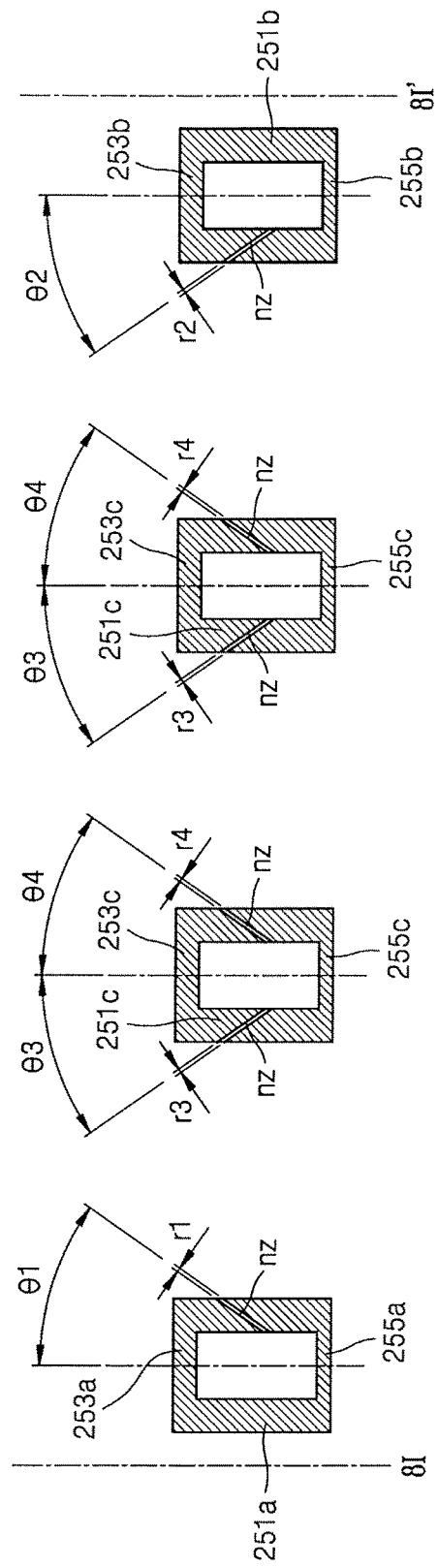
FIG. 8B is a cross-sectional view taken along a line 8I-8I' of FIG. 8A, according to an exemplary embodiment of the inventive concept.

FIG. 8A is a perspective view illustrating pipe structures 250a, 250b, and 250c included in a test group TG of the semiconductor module testing equipment 1000 of FIG. 1, according to an exemplary embodiment of the inventive concept. FIG. 8B is a cross-sectional view taken along a line 8I-8I' of FIG. 8A, according to an exemplary embodiment of the inventive concept.

Referring to FIGS. 8A and 8B, the fluid FL inside the pipe structures 250a, 250b, and 250c and the fluid outside the pipe structures 250a, 250b, and 250c may be separated by pipe side walls 251a, 251b, and 251c, pipe upper surfaces 253a, 253b, and 253c, and pipe bottom surfaces 255a, 255b, and 255c of the pipe structures 250a, 250b, and 250c. The pipe side walls 251a, 251b, and 251c refer to surfaces which may extend in the first direction (the direction X) and may be disposed on the top plate 200 to be substantially perpendicular to an upper surface of the top plate 200. The pipe side walls 251a, 251b, and 251c may include portions extending in the first direction (the direction X) or the second direction (the direction Y) and perpendicular to the second direction (the direction Y) in the drawings. Also, the pipe upper surfaces 253a, 253b, and 253c and the pipe bottom surfaces 255a, 255b, and 255c may extend in the first direction (the direction X) and may be disposed on the top plate 200 in parallel to the upper surface of the top plate 200. The pipe upper surfaces 253a, 253b, and 253c, and the pipe bottom surfaces 255a, 255b, and 255c may include portions extending in the first direction (the direction X) and the second direction (the direction Y) and perpendicular to the third direction (the direction Z). The pipe structures 250a, 250b, and 250c may have curved ends to penetrate through the bridge portions 228 of the fixing handle 220 or to pass outside of the bridge portions 228. For example, the pipe structures 250a, 250b, and 250c may each include crooked, bent or curved portions at both ends thereof. Each of the crooked, bent or curved portions may be bent in different directions. However, the shape of the pipe structures 250a, 250b, and 250c is not limited thereto. For example, in an exemplary embodiment of the inventive concept, the shape of the pipe structures 250a, 250b, and 250c may be substantially linear.

The nozzles nz may be formed from the pipe side walls 251a, 251b, and 251c to be connected to the inside of the pipe structures 250a, 250b, and 250c. For example, the nozzles nz may be perforations on the pipe side walls 251a, 251b, and 251c. The nozzles nz may be arranged on the pipe side walls 251a, 251b, and 251c in the first direction (the direction X) and may be spaced apart from one another by a certain distance. However, the arrangement of the nozzles nz is not limited thereto. For example, the nozzles nz may be formed on the pipe upper surfaces 253a, 253b, and 253c. The pipe structures 250a, 250b, and 250c are described to have a rectangular parallelepiped shape which is empty inside. However, the inventive concept is not limited thereto. For example, the pipe structures 250a, 250b, and 250c may have various shapes, such as a round pipe shape, a square or rectangular pipe shape, an oval shape, or the like. For example, the pipe structures 250a, 250b, and 250c may be hollow.

The nozzles nz may be arranged on the pipe structures 250a, 250b, and 250c in the second direction (the direction Y) and the third direction (the direction Z) and may be spaced apart from one another in the first direction (the direction X). As described above, the four pipe structures 250a, 250b, and 250c may be included in one test group TG. The pipe structures 250a, 250b, and 250c may include two inner pipe structures 250c interposed between the first and second pipe structures 250a and 250b as shown in FIGS. 8A and 8B. However, arrangement of the pipe structures 250a, 250b, and 250c is not limited thereto. For example, more than two or less than two inner pipe structures 250c may be provided in the pipe structures 250a, 250b, and 250c, depending on the number of semiconductor modules 300 included in the test group TG.

A nozzle array nzar1 may be formed at the pipe side walls 251a and/or 251b of the first and second pipe structures 250a and 250b. For example, the nozzle array nzar1 may be formed at the pipe side wall 251a or 251b, which is more adjacent to the semiconductor module 300, of the two pipe side walls 251a and 251b facing each other. The first and second pipe structures 250a and 250b correspond to one semiconductor module 300, and thus, the nozzle array nzar1 may be formed at the pipe side wall 251a or 251b corresponding to the semiconductor module 300. The nozzle array nzar1 may correspond to the semiconductor stacks 320 formed at one side surface of a semiconductor module 300. Referring to FIG. 8A, it is illustrated that one nozzle array nzar1 is formed at one of the pipe side walls 251a and 251b. However, the inventive concept is not limited thereto. For example, a plurality of nozzle arrays nzar1 may be formed at one pipe side wall 251a or 251b to be apart from one another in the third direction (the direction Z) to create a desired testing environment. To create the desired testing environment, the speed, amount of flow, direction of flow, etc. of a fluid discharged from each nozzle nz may be adjusted.

When the nozzle array nzar1 is formed at the pipe upper surfaces 253a and 253b of the first and second pipe structures 250a and 250b, a profile of each nozzle nz may be configured such that a fluid discharged from the nozzle nz may be directed toward the semiconductor stack 320, which is disposed most adjacent to the nozzle nz.

The nozzle arrays nzar1 may be formed at the pipe side walls 251c facing the inner pipe structures 250c. Since the semiconductor module 300 faces each of the pipe side walls 251c, which face the inner pipe structures 250c, the nozzle array nzar1 may be formed at each of the pipe side walls 251c. Here, each nozzle array nzar1 may correspond to the semiconductor stacks 320 on a side surface of the semiconductor module 300. In some cases, each of the inner pipe structures 250c may include a plurality of nozzle arrays nzar1 that are arranged at the pipe side wall 251c and spaced apart from one another in the third direction (the direction Z), like the first and second pipe structures 250a and 250b.

When the nozzle array nzar1 is formed at the pipe upper surfaces 253c of the inner pipe structures 250c, the inner pipe structures 250c may include a plurality of nozzle arrays nzar1 arranged to be spaced apart from one another in the second direction (the direction Y). At least some of the plurality of nozzle arrays nzar1 may be configured to discharge the fluid FL toward the semiconductor stack 320, which is disposed at a side of the semiconductor module 300 in the second direction (the direction Y). The rest of the plurality of nozzle arrays nzar1 may be configured to discharge the fluid FL toward the semiconductor stack 320 disposed at the other side of the semiconductor module 300 in the second direction (the direction Y). The nozzles nz may have a linear shape extending in the first direction (the direction X). Accordingly, the cooling and the heating fluid FL may be uniformly discharged toward the semiconductor stacks 320 from the nozzles nz.

From a section that is perpendicular to the first direction (the direction X), as shown in FIG. 8B, the nozzles nz formed at the first pipe structure 250a may have a first nozzle orientation angle θ1 with respect to the third direction (the direction Z). The nozzles nz formed at the second pipe structure 250b may have a second nozzle orientation angle θ2 with respect to the third direction (the direction Z). The nozzles nz formed at the pipe side wall 251c of the inner pipe structure 250c, which is adjacent to the first pipe structure 250a, may have a third nozzle orientation angle θ3 with respect to the third direction (the direction Z). The nozzles nz formed at the pipe side wall 251c of the inner pipe structure 250c, which is adjacent to the second pipe structure 250b, may have a fourth nozzle orientation angle θ4 with respect to the third direction (the direction Z). In some cases, the first through fourth orientation angles θ1 through θ4 may be substantially the same, but the inventive concept is not limited thereto. When the first through fourth orientation angles θ1 through θ4 are less than a certain angle, the nozzles nz may be formed at the pipe upper surfaces 253a, 253b, and 253c. When the first through fourth orientation angles θ1 through θ4 are greater than the certain angle, the nozzles nz may be formed at the pipe lower surfaces 255a, 255b, and 255c. Relative locations of the pipe structures 250a, 250b, and 250c with respect to the semiconductor stacks 320 may be determined based on the first through fourth orientation angles θ1 through θ4. For example, when the first through fourth orientation angles θ1 through θ4 are equal to or greater than 90, the pipe structures 250a, 250b, and 250c may be disposed at a lower level than the semiconductor stacks 320. When the first through fourth orientation angles θ1 through θ4 are equal to or less than 90°, the pipe structures 250a, 250b, and 250c may be disposed at a higher level than the semiconductor stacks 320.

When the nozzle arrays nzar1 are formed at the pipe upper surfaces 253c of the inner pipe structures 250c, two nozzle arrays nzar1 may be formed at the pipe upper surfaces 253c. In some cases, the nozzle arrays nzar1 may respectively correspond to a pair of edges extending in the first direction (the direction X). In this case, each nozzle array nzar1 is formed adjacent to each corresponding edge. Each nozzle array nzar1 may discharge the fluid FL toward the semiconductor module 300 which is more adjacent to the corresponding edge. However, the inventive concept is not limited thereto, and one nozzle array nzar1 or more than three nozzle arrays nzar1 may be formed at the pipe upper surface 253c.

When the nozzles nz have shapes of a circular hole, sizes of the nozzles nz may be defined by the diameter of the nozzles. The nozzles nz formed at the first pipe structure 250a may have a first nozzle diameter r1, and the nozzles nz formed at the second pipe structure 250b may have a second nozzle diameter r2. The nozzles nz formed at the pipe side wall 251c of the inner pipe structure 250c, which is adjacent to the first pipe structure 250a, may have a third nozzle diameter r3. The nozzles nz formed at the pipe side wall 251c of the inner pipe structure 250c, which is adjacent to the second pipe structure 250b, may have a fourth nozzle diameter r4. For example, the first through fourth nozzle diameters r1 through r4 may have values ranging from about 0.1 mm to about 0.3 mm, but the inventive concept is not limited thereto. In some cases, the first through fourth nozzle diameters r1 through r4 may be substantially the same, but the inventive concept is not limited thereto. In some cases, the nozzles nz may have linear shapes, and in this case, sizes of the nozzles nz may be defined as an extension length in the first direction (the direction X) or a width in the third direction (the direction Y).

The cooling or the heating fluids FL may be discharged toward the memory module through the nozzles nz. In some cases, each of the nozzles nz may correspond to one of the semiconductor stacks 320 included in the semiconductor modules 300. Alternatively, a distance between neighboring nozzles nz in the first direction (the direction X) may be substantially the same as a distance between centers of neighboring semiconductor stacks 320 in the first direction (the direction X). However, the inventive concept is not limited thereto, and two or more nozzles nz may correspond to one semiconductor stack 320. Alternatively, two semiconductor stacks 320 may correspond to one or more nozzles nz.

According to an approach of supplying a cooling or a heating fluid FL to one end or both ends of a semiconductor module, an externally installed fan or heater may be used, or the fluid FL may be spun into a vortex due to heat emission of the semiconductor stacks 320. For example, due to the non-uniform temperature distribution of the semiconductor stacks 320 (due to heat emission), the flow of the cooling or the heating fluid FL may be distorted to an upper perpendicular direction with respect to a test board surface. Accordingly, the cooling or the heating fluid FL might not be sufficiently supplied to some of the semiconductor stacks 320. Thus, the testing of the performance of an operation of the semiconductor module at a particular temperature may be inaccurate.

According to an exemplary embodiment of the inventive concept, the cooling or the heating fluid FL is directly ejected toward the semiconductor stacks 320. Accordingly, even when there is a temperature difference due to an operation difference among the semiconductor stacks 320, the distortion of the flowing direction of the cooling or the heating fluid FL may be prevented. Thus, the heating/cooling fluid FL may be stably and reliably supplied to the semiconductor stacks 320 to uniformly retain a temperature in the semiconductor module testing system 10. Accordingly, the reliability of the semiconductor module test may be increased.

Sections of the pipe structures 250a, 250b, and 250c illustrated in FIGS. 7A through 8B in the first direction (the direction X) may have shapes of an empty (e.g., hollow) rectangle. However, the inventive concept is not limited thereto, and the sections of the pipe structures 250a, 250b, and 250c in the first direction (the direction X) may have shapes of an empty circle, an empty oval, or other empty polygons.

Figure 9:
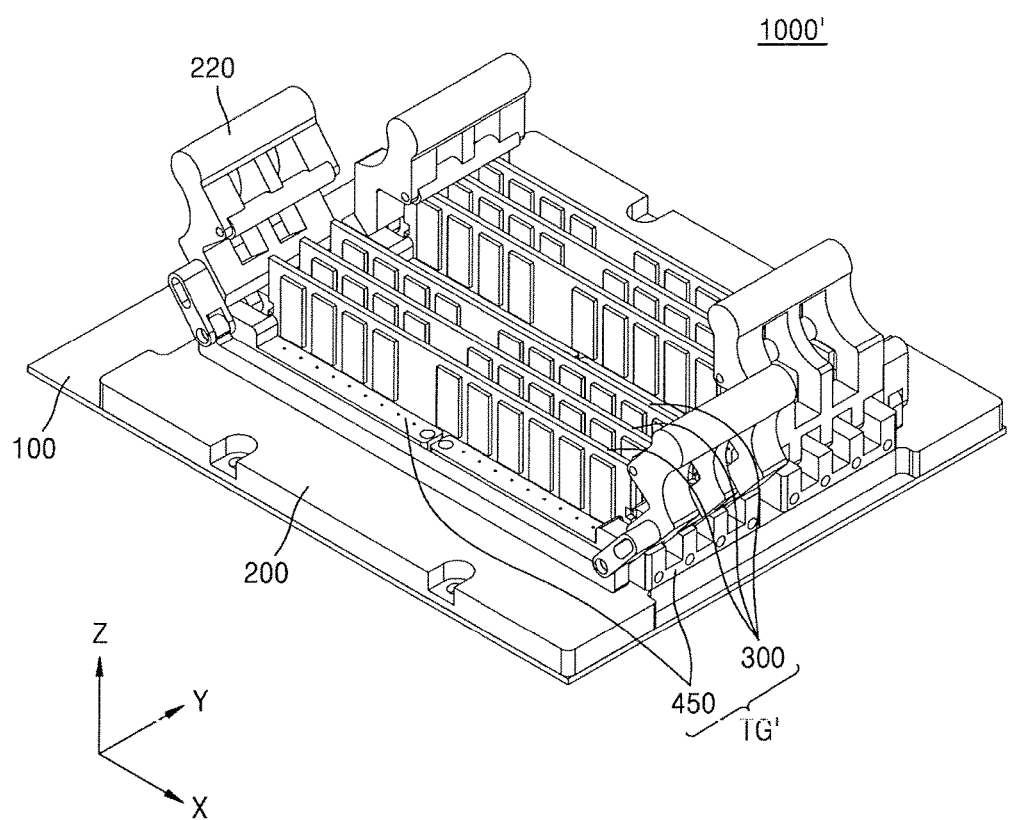
FIG. 9 is a perspective view illustrating the semiconductor module testing equipment of FIG. 1 according to an exemplary embodiment of the inventive concept.

FIG. 9 is a perspective view illustrating the semiconductor module testing equipment of FIG. 1 according to an exemplary embodiment of the inventive concept.

Referring to FIG. 9, two pipe structures 450 and three semiconductor modules 300 are included in one test group TG'. Two test groups TG' are included in one piece of semiconductor module testing equipment 1000. Each of the two pipe structures 450 included in one test group TG' may correspond to some of the semiconductor modules 300. For example, when one pipe structure 450 corresponds to a portion from central portions of the semiconductor modules 300 to ends of the semiconductor modules 300 in the first direction (the direction X), the other pipe structure 450 may correspond to a portion from the central portions of the semiconductor modules 300 to the other ends of the semiconductor modules 300 in the first direction (the direction X).

Figure 10A:
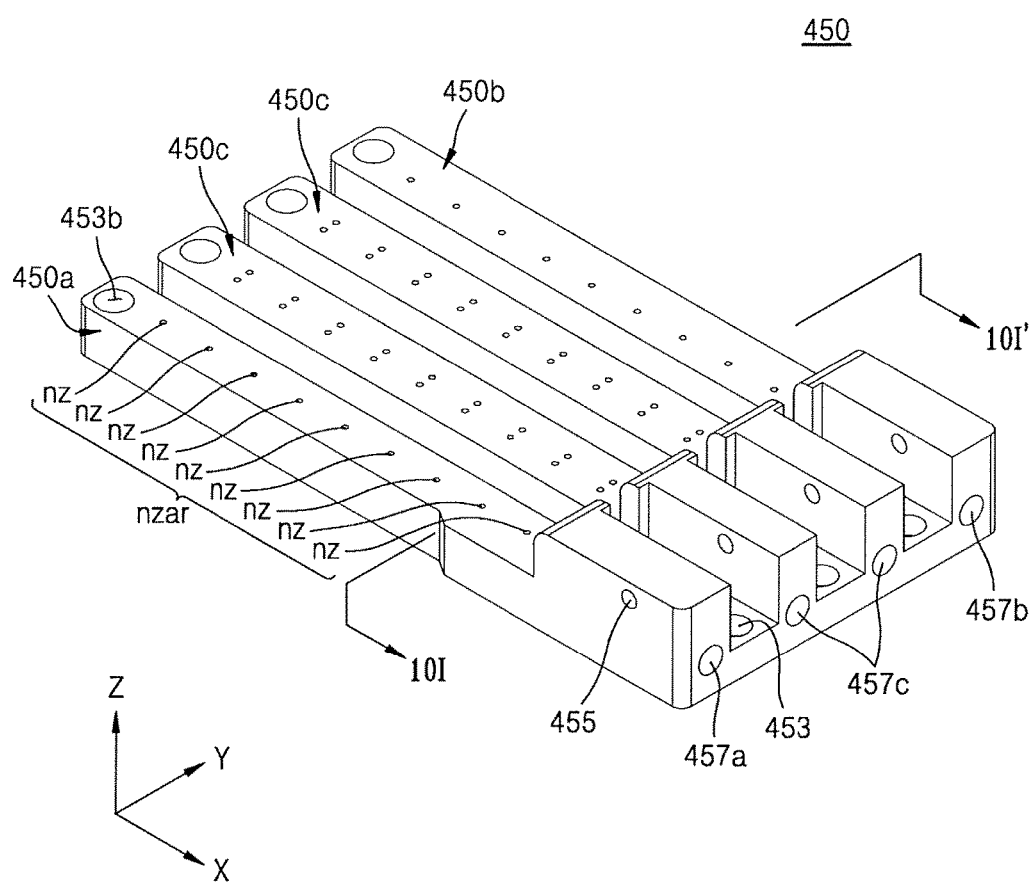
FIG. 10A is a perspective view illustrating pipe structures included in the semiconductor module testing equipment of FIG. 1, according to an exemplary embodiment of the inventive concept.
Figure 10B:
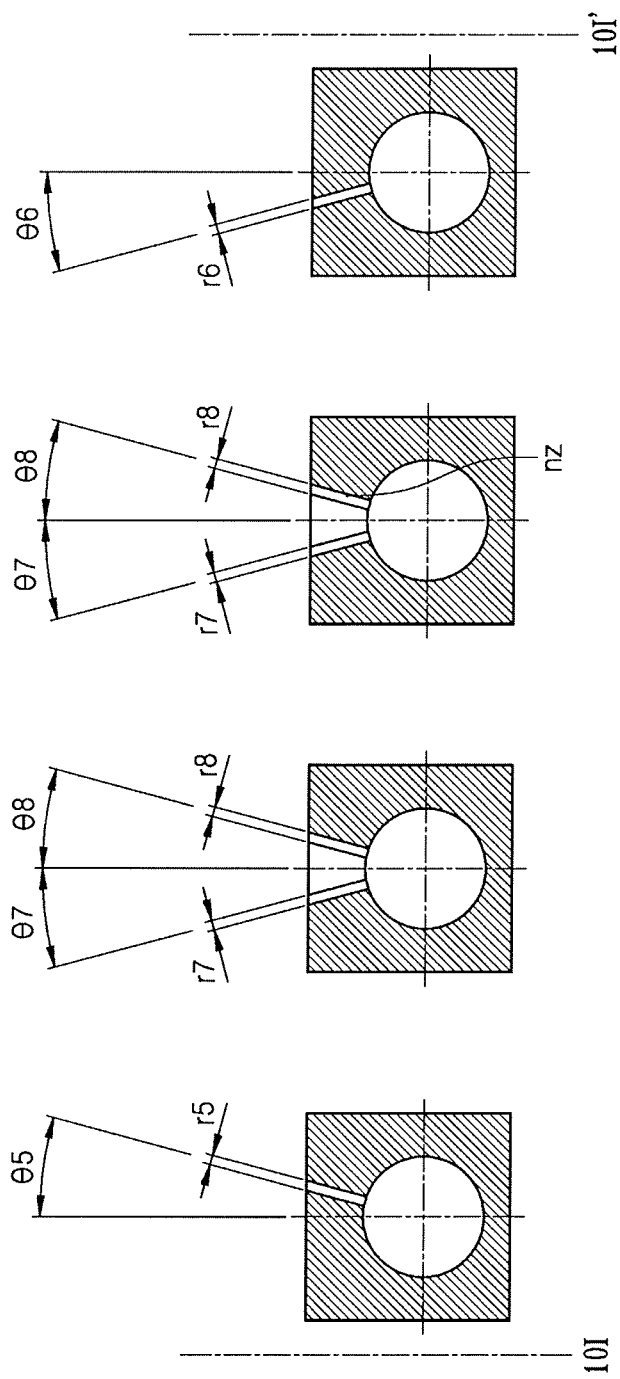
FIG. 10B is a cross-sectional view taken along a line 10I-10-I' of FIG. 10A, according to an exemplary embodiment of the inventive concept.

FIG. 10A is a perspective view illustrating pipe structures included in the semiconductor module testing equipment of FIG. 1, according to an exemplary embodiment of the inventive concept. FIG. 10B is a cross-sectional view taken along a line 10I-10-I' of FIG. 10A, according to an exemplary embodiment of the inventive concept.

A pipe structure 450 includes a first pipe 450a and a second pipe 450b arranged at the ends of the pipe structure 450 in the second direction, and inner pipes 450c interposed between the first and second pipes 450a and 450b. Fixing handler coupling holes 455 may be formed at locations of the pipe structure 450, which correspond to ends of the semiconductor modules 300. The fixing handler coupling holes 455 may align the fixing handle 220 with the pipe structure 450 so that the fixing handle 220 and the pipe structure 450 are stably coupled to each other. A rotational axis member and a handler arm may be coupled to the fixing handler coupling holes 455. After the semiconductor modules 300 are coupled to the semiconductor module sockets 120, the fixing handle 220 may proceed to make the semiconductor modules 300 and the semiconductor module sockets 120 be stably coupled to each other.

A plurality of top plate coupling holes 453b may be included at both ends of the pipe structure 450 in the first direction (the direction X). After the pipe structure 450 is disposed on the top plate 200, a coupling member may be coupled to the top plate coupling holes 453b so that the pipe structure 450 may be firmly supported by the top plate 200 and stably coupled to the top plate 200.

The pipe structure 450 may include the first and second pipes 450a and 450b, and the inner pipes 450c interposed between the first and second pipes 450a and 450b. The first and second pipes 450a and 450b correspond to the first and second pipe structures 250a and 250b described with reference to FIGS. 7 through 8B. Thus, the first and second pipes 450a and 450b may include a nozzle array corresponding to the closest semiconductor stack 320.

The inner pipes 450c may include nozzle arrays nzar for two adjacent semiconductor stacks 320 connected to the inner pipe structures 250c, as described with reference to FIGS. 7 through 8B. Fluid injection holes 457a, 457b, and 457c may be formed at ends of the first and second pipes 450a and 450b and the inner pipes 450c to provide cooling and heating fluids FL from the fluid supply channel 3000 (refer to FIG. 1).

Referring to FIG. 10B, nozzles nz, formed at the first pipe 450a may have a fifth nozzle orientation angle θ5 with respect to the third direction (the direction Z). Nozzles nz formed at the second pipe 450b may have a sixth nozzle orientation angle θ6 with respect to the third direction (the direction Z). Nozzles nz formed at the inner pipe 450c, which is more adjacent to the first pipe 450a than the other inner pipe 450c, may have a seventh nozzle orientation angle θ7 with respect to the third direction (the direction Z). Nozzles nz formed at the inner pipe 450c, which is more adjacent to the second pipe 450b than the other inner pipe 450c, may have an eighth nozzle orientation angle θ8 with respect to the third direction (the direction Z). In some cases, the fifth through eighth orientation angles θ5 through θ8 may be substantially the same, but the inventive concept is not limited thereto.

When the nozzles nz have shapes of a circular hole, sizes of the nozzles nz may be defined as diameters of the nozzles. The nozzles nz formed at the first pipe 450a may have a fifth nozzle diameter r5, and the nozzles nz formed at the second pipe 450b may have a sixth nozzle diameter r6. The nozzles nz formed at the inner pipe 450c, which is more adjacent to the first pipe 450a than the other inner pipe 450c, may have a seventh nozzle diameter r7, and the nozzles nz formed at the inner pipe 450c, which is more adjacent to the second pipe 450b than the other inner pipe 450c, may have an eighth nozzle diameter r8. In some cases, the fifth through eighth nozzle diameters r5 through r8 may be substantially the same, but the inventive concept is not limited thereto. For example, the fifth through eighth nozzle diameters r5 through r8 may have values ranging from about to 0.1 mm to about 0.3 mm. In some cases, the nozzles nz may have linear shapes, and in this case, the sizes of the nozzles nz may be defined as an extension length in the first direction (the direction X) and a width in the third direction (the direction Y).

Referring to FIG. 10B, the first and second pipes 450a and 450b and the inner pipes 450c may have cylindrical-shaped inner spaces. However, the inventive concept is not limited thereto, and the inner spaces formed in the first and second pipes 450a and 450b and the inner pipes 450c may be oval, round or polygonal.

Figure 11A:
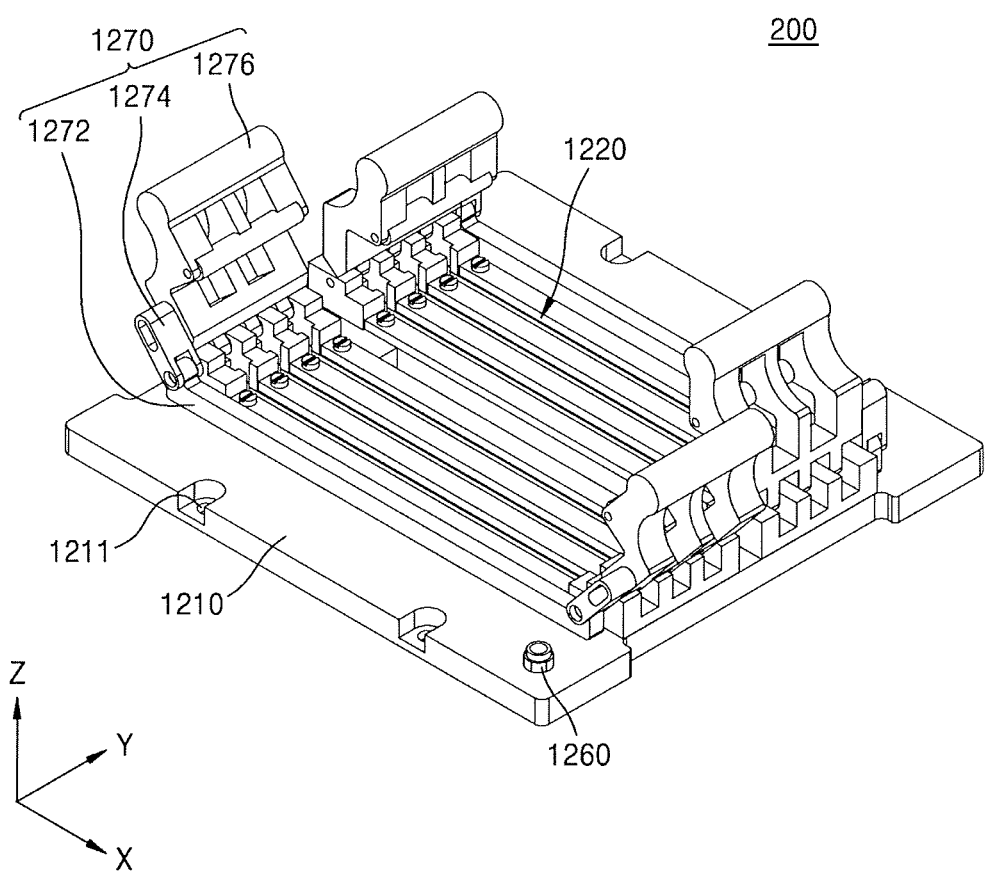
FIGS. 11A through 11C are a perspective view, a top plan view and a bottom plan view, respectively, of a top plate included in the semiconductor module testing equipment of FIG. 1, according to an exemplary embodiment of the inventive concept.
Figure 11B:
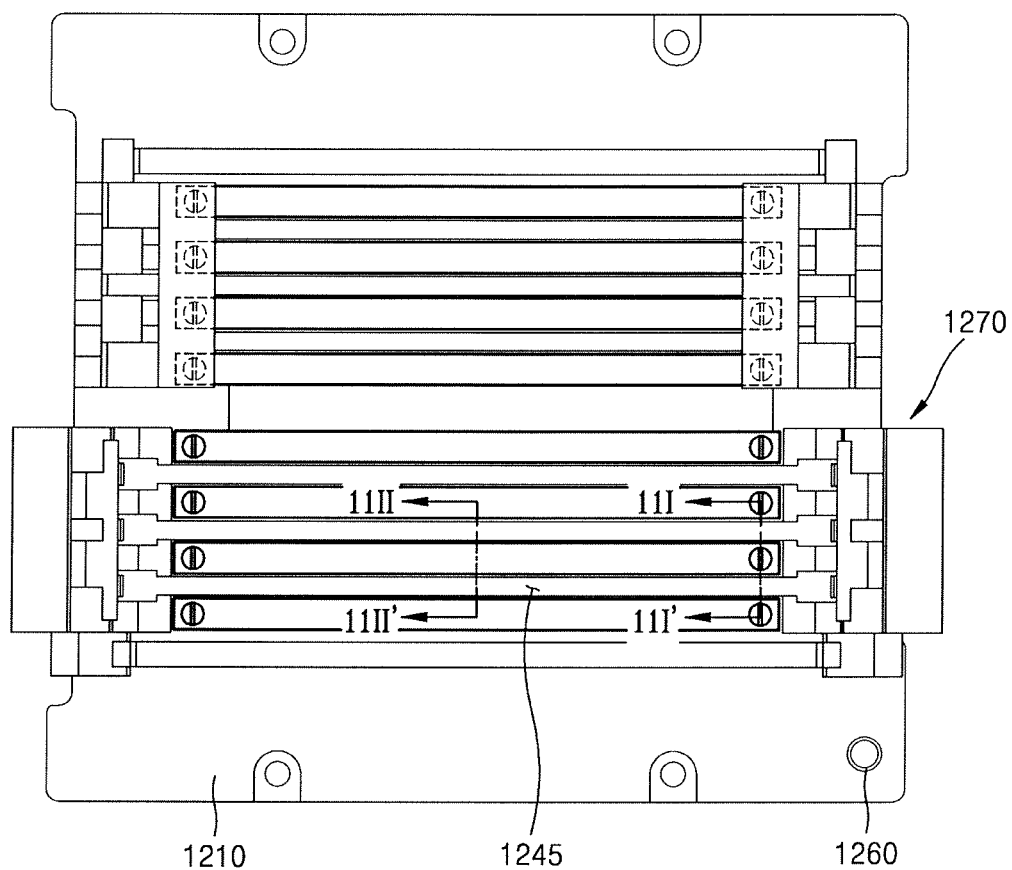
Figure 11C:
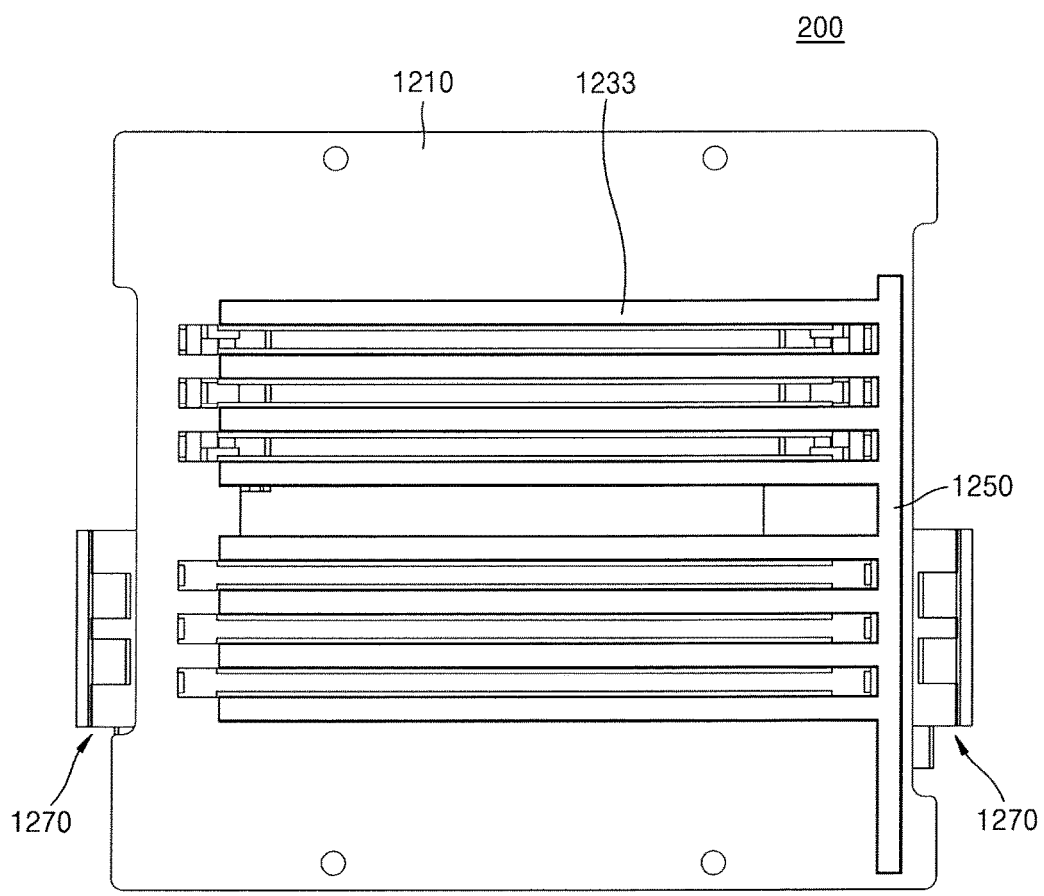
Figure 12A:
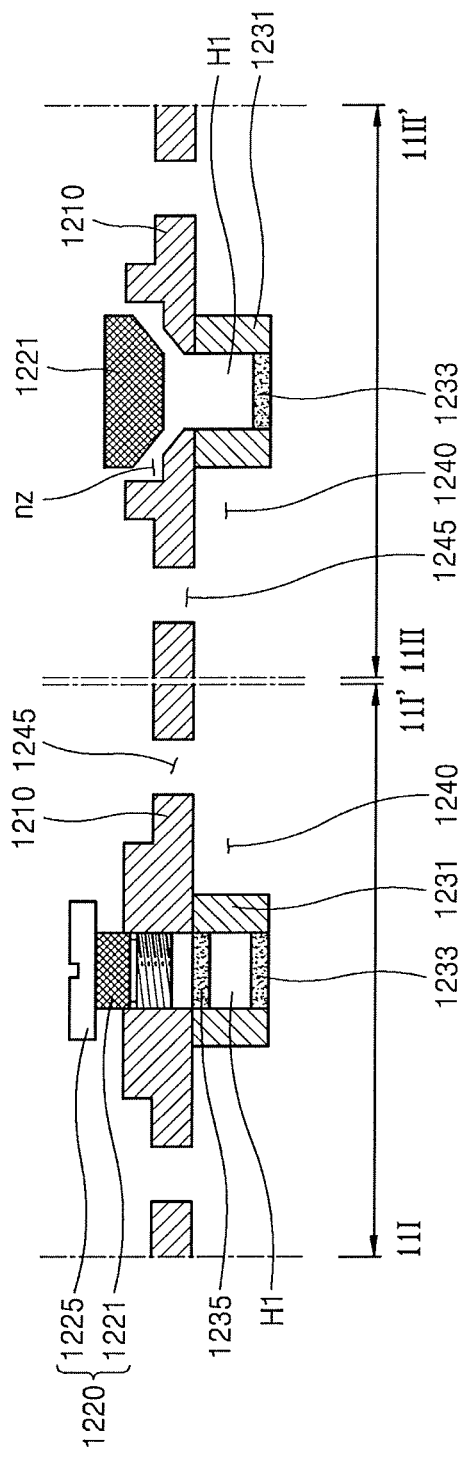
FIG. 12A is a cross-sectional view taken along line 11I-11I' of FIG. 11B, according to an exemplary embodiment of the inventive concept.
Figure 12B:
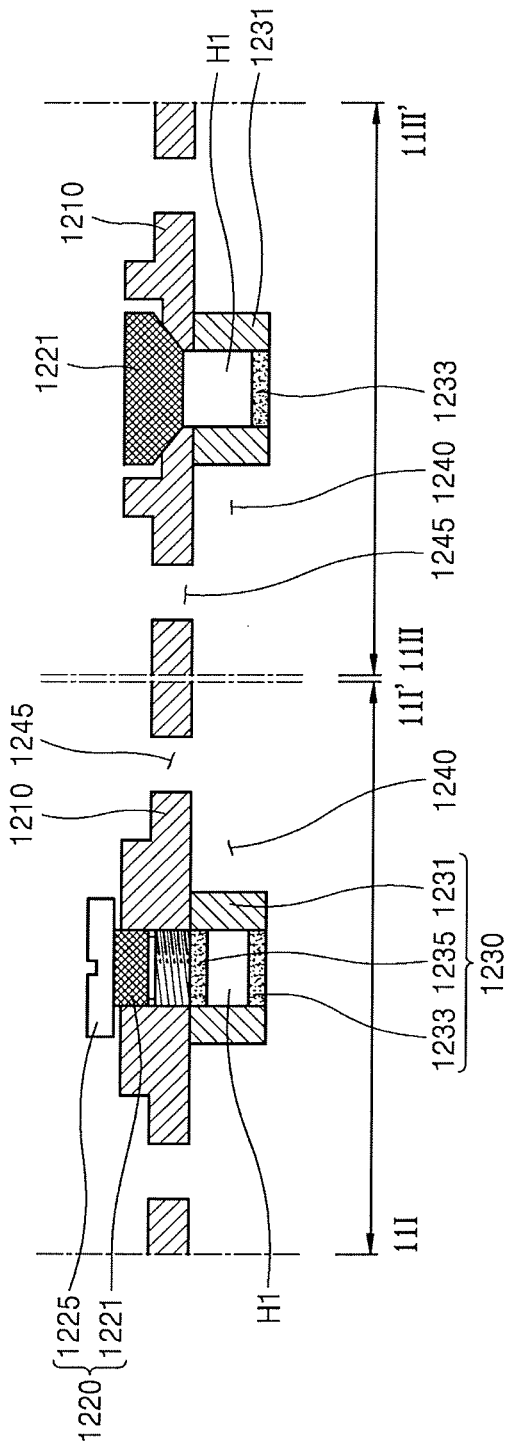
FIG. 12B is a cross-sectional view taken along line 11II-11II' of FIG. 11B, according to an exemplary embodiment of the inventive concept.

FIGS. 11A through 11C are a perspective view, a top plan view and a bottom plan view, respectively, of a top plate 200 included in the semiconductor module testing equipment 1000 of FIG. 1, according to an exemplary embodiment of the inventive concept. FIG. 12A is a cross-sectional view taken along line 11I-11I' of FIG. 11B, according to an exemplary embodiment of the inventive concept. FIG. 12B is a cross-sectional view taken along line 11II-11II' of FIG. 11B, according to an exemplary embodiment of the inventive concept. FIGS. 12A and 12B may be used for describing an operation of an adjusting member 1220.

The top plate 200, described hereinafter with reference to FIGS. 11A through 11C, corresponds to the top plate 200 illustrated in FIG. 2. The top plate 200 may be coupled to the test board 100 and may expose insertion portions of the semiconductor module sockets 120. The insertion portions of the semiconductor module sockets 120 may be inner spaces of the semiconductor module sockets 120. The semiconductor modules 300, etc., may be inserted into the exposed insertion portions.

The top plate 200 may be coupled to the test board 100 to protect the test board 100 from impurities, and may increase a mechanical rigidity of the test board 100. The top plate 200 may include a body portion 1210, pipe structures 1230, the adjusting member 1220, a fluid injection hole 1260, and a fluid distributor 1250. The top plate 200 may include a plastic substrate, a semiconductor substrate, and/or a metal substrate, but the inventive concept is not limited thereto. The fluid injection hole 1260 may include a fluid injection pipe 1261 and an injection hole adjusting member 1263, when needed. Fluids injected to the fluid injection hole 1260 from the outside (e.g., from the fluid supply channel 3000) may be distributed to each pipe structure 1230 through the fluid distributor 1250, and may be discharged toward the semiconductor stacks 320 included in the semiconductor modules 300, through each nozzle nz.

The body portion 1210 is a main body of the top plate 200 and may support the whole top plate 200 so that the components included in the top plate 200 are firmly coupled to one another. For the top plate 200 and the test board 100 to be firmly coupled to each other, the body portion 1210 may include a plurality of coupling grooves 1211 to which coupling members, such as bolts, screws and nuts, are coupled.

Fixing handles 1270 may be provided at both ends of the body portion 1210 in the first direction (the direction X). The fixing handles 1270 may include a handle supporter 1272, a handle arm 1274, and a handle head 1276. The fixing handles 1270 may be substantially the same as the fixing handles 220 described with reference to FIG. 5.

The top plate 200 may include the plurality of pipe structures 1230 disposed under a bottom surface of the body portion 1210 to extend in the first direction (the direction X), and to be spaced apart from one another in the second direction (the direction Y). In the drawings, it is illustrated that a total of 8 parallel pipe structures 1230 are provided. However the inventive concept is not limited thereto. The number and the arrangement of pipe structures 1230 may vary according to the number and the arrangement of the semiconductor module sockets on the test board 100.

Socket coupling grooves 1240 may be defined by the pipe structures 1230, which are adjacent to each other and spaced apart from each another. For example, the semiconductor module sockets 120 may be inserted between the pipe structures 1230, which are spaced apart from each another. Thus, the test board 100 and the top plate 200 may be coupled to each other.

The top plate 200 may include semiconductor module coupling holes 1245 extending in the first direction (the direction X) and connected to the socket coupling grooves 1240, which penetrate the top plate 200 in the third direction (the direction Z). In this case, the semiconductor module coupling holes 1245 may expose the insertion units, which are defined as the inner spaces of the semiconductor module sockets 120. For example, when the semiconductor modules 300 are inserted into the semiconductor module sockets 120, the top plate 200 may be penetrated by the semiconductor modules 300.

The adjusting member 1220 may be disposed on the pipe structures 1230. The adjusting member 1220 may include nozzle plugs 1221 and an adjusting screw 1225. Like the pipe structures 1230, the nozzle plugs 1221 may extend in the first direction (the direction X) and may be spaced apart from one another in the second direction (the direction Y).

A mechanism in which the adjusting member 1220 adjusts a size or a profile of the nozzle will be described with reference to FIGS. 12A and 12B. The adjusting member 1220 may include the nozzle plugs 1221 and the adjusting screw 1225. The nozzle plugs 1221 and the adjusting screw 1225 may be fixed to each other in the third direction (the direction Z) and do not relatively move with respect to each other. The adjusting screw 1225 may rotate with an axis of the nozzle plugs 1221 in the third direction (the direction Z) as a rotation axis. The adjusting screw 1225 may move upward and downward with respect to the body portion 1210 by external manipulation (e.g., by rotating the adjusting screw 1225). Accordingly, the nozzle plugs 1221 may move upward and downward and adjust the size or the profile of the nozzle(s) nz. For example, FIG. 12A illustrates a state in which the adjusting member 1220 is lifted to an uppermost level to completely open the nozzle(s) nz and FIG. 12B illustrates a state in which the adjusting member 1220 is lowered to a lowermost level to completely close the nozzle(s) nz.

In addition, a relative height of the adjusting screw 1225 with respect to the body portion 1210 may be changed to realize various desired sizes or profiles of the nozzle(s) nz, to adjust an amount, a flow direction and a speed of a fluid discharged from the nozzle(s) nz. For example, when the size of the nozzle(s) nz decreases, the flow speed of the fluid FL may increase, and when the size of the nozzle(s) nz increases, the flow speed of the fluid FL may decrease. Also, by adjusting the profile of the nozzle nz, an angle of the nozzle nz in the third direction (the direction Z) may be adjusted so that an orientation angle of the discharged fluid FL may be adjusted. For example, when the adjusting member 1220 rises, the orientation angle of the nozzle nz decreases, and thus, the orientation angle of the discharged fluid FL may decrease. That the orientation angle of the fluid decreases may denote that a ratio of a portion of a horizontal direction (the directions X and Y) to a portion of a perpendicular direction (the direction Z) increases, when a flow direction vector is considered. Also, when the adjusting member 1220 descends, the orientation angle of the nozzle increases, and thus, the orientation angle of the discharged fluid FL may increase. An increase in the orientation angle of the fluid may denote that a ratio of the portion of the perpendicular direction (the direction Z) to the portion of the horizontal direction (the directions X and Y) increases, when the flow direction vector is considered. In some cases, when the nozzle nz is completely closed, as illustrated in FIG. 12B, the nozzle nz may act as a valve. Thus, by the adjustment of the adjusting member 1220, a heating and a cooling environment that is appropriate for testing a semiconductor module may be realized. Also, when the nozzles nz have tube shapes, the fluid FL discharged from the nozzles nz bumps into the adjusting member 1220, and then is discharged to the memory module. Thus, the fluid FL may be discharged uniformly over the memory module rather than being concentrated at one point of the memory module.

FIGS. 13A through 13E are enlarged views illustrating a portion of a pipe structure 1230 included in the semiconductor module testing equipment 1000 of FIG. 1, according to exemplary embodiments of the inventive concept.

A fluid FL in an inner portion H1 of the pipe structures 1230 may be separated from the outside by a lower ceiling 1233, a pipe side wall 1231, and a top ceiling 1235, except an area of the inner portion H1 where the nozzles nz are formed. The top ceiling 1235 of the pipe structures 1230 may include the nozzles nz. For example, the nozzles nz may be defined by the areas at which the top ceiling 1235 is not formed.

Figure 13A:
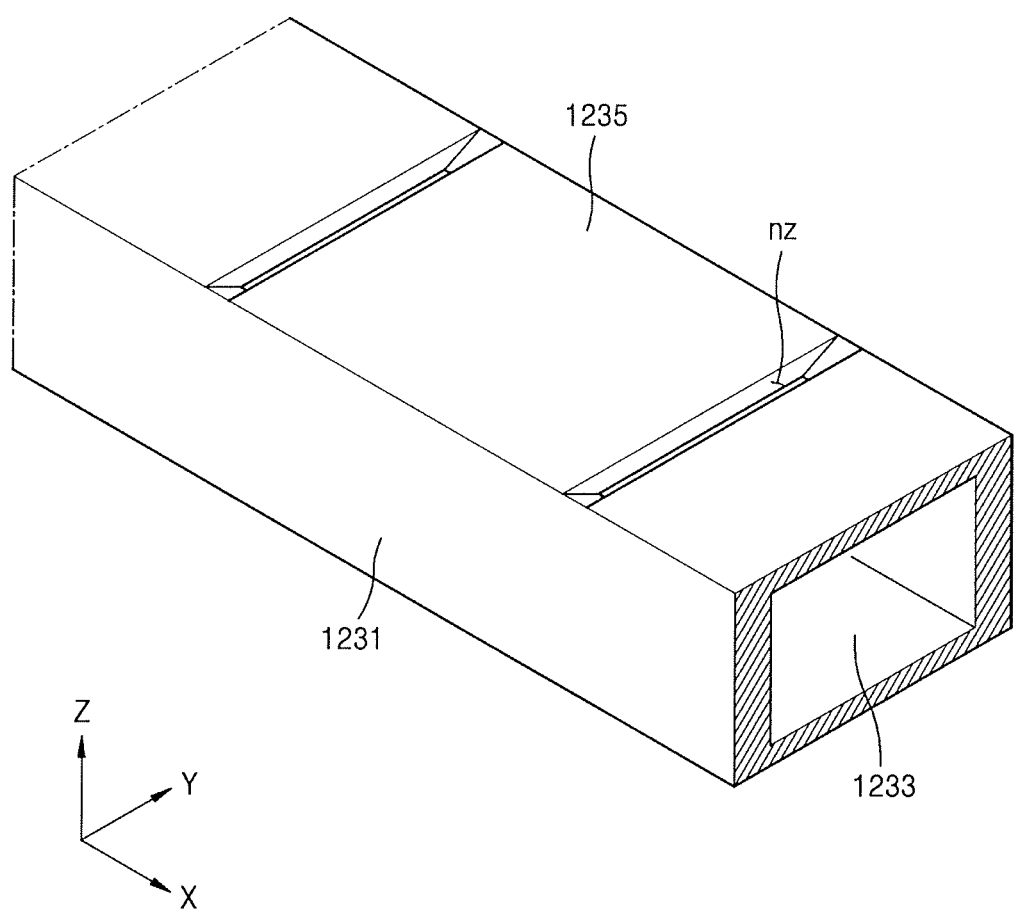
FIGS. 13A through 13E are enlarged views illustrating a portion of a pipe structure included in the semiconductor module testing equipment of FIG. 1, according to exemplary embodiments of the inventive concept.
Figure 13B:
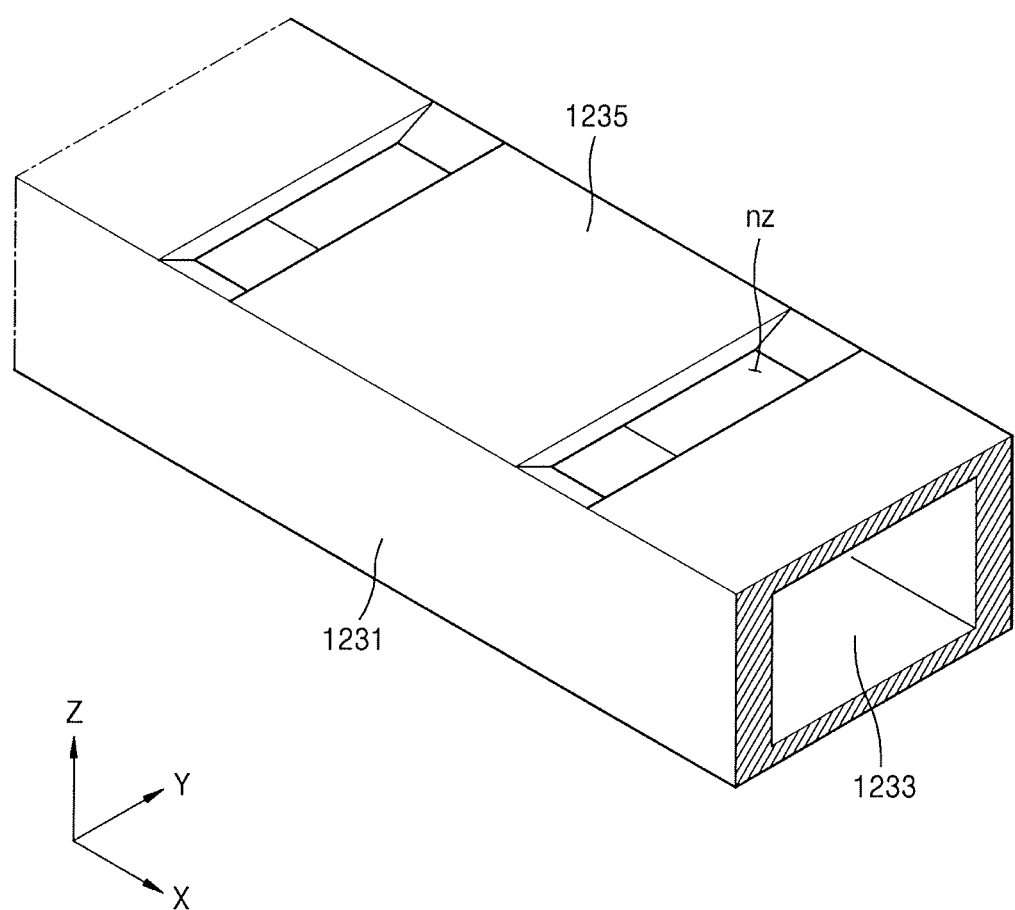
Figure 13C:
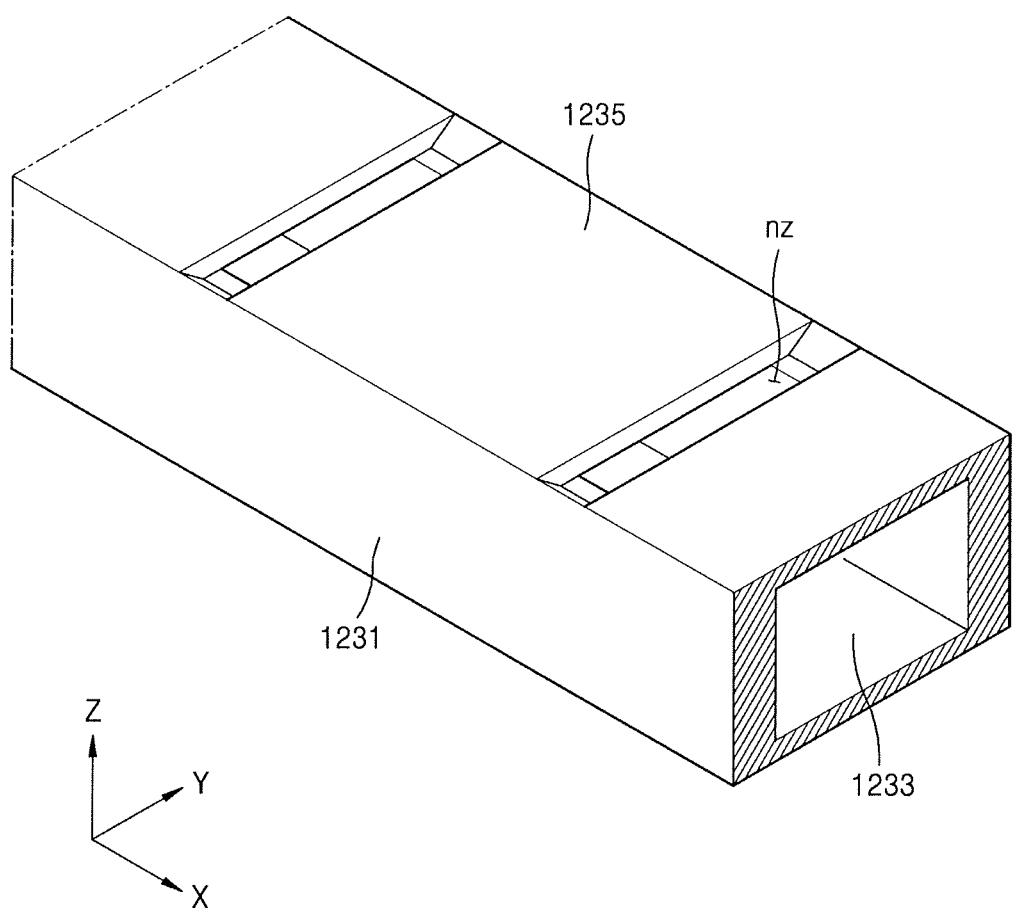
Figure 13D:
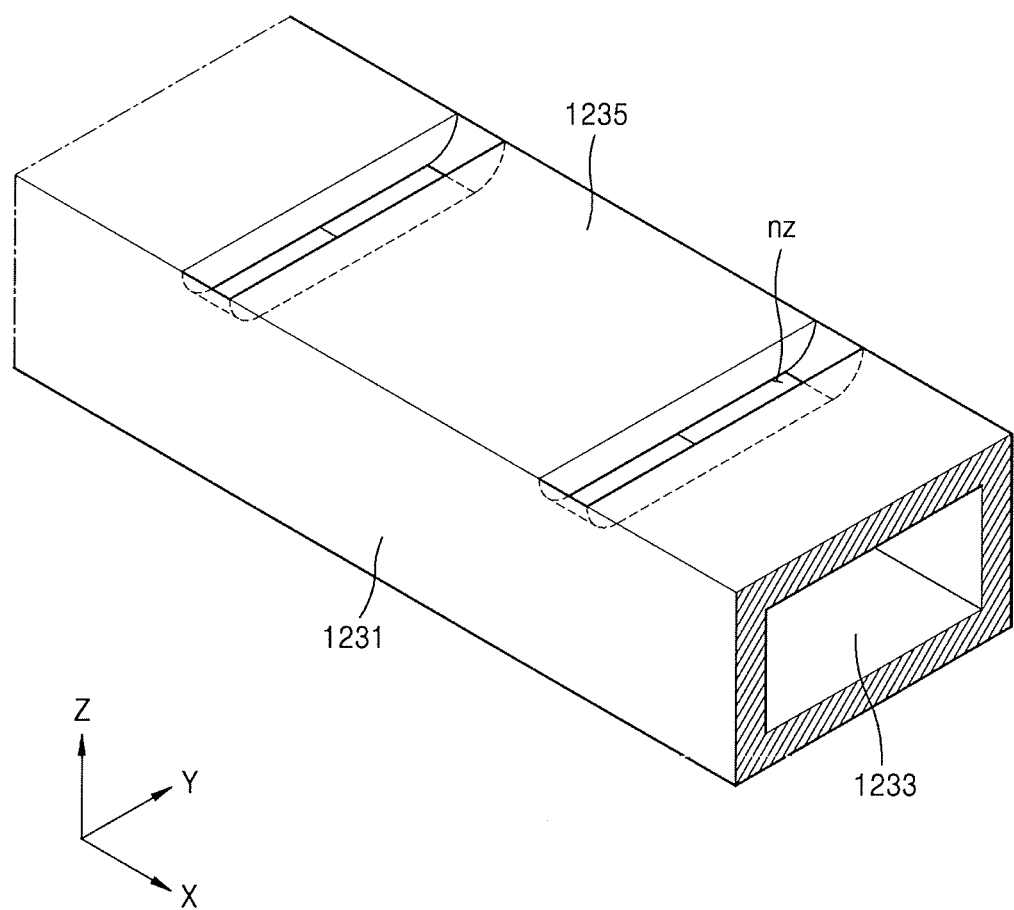
Figure 13E:
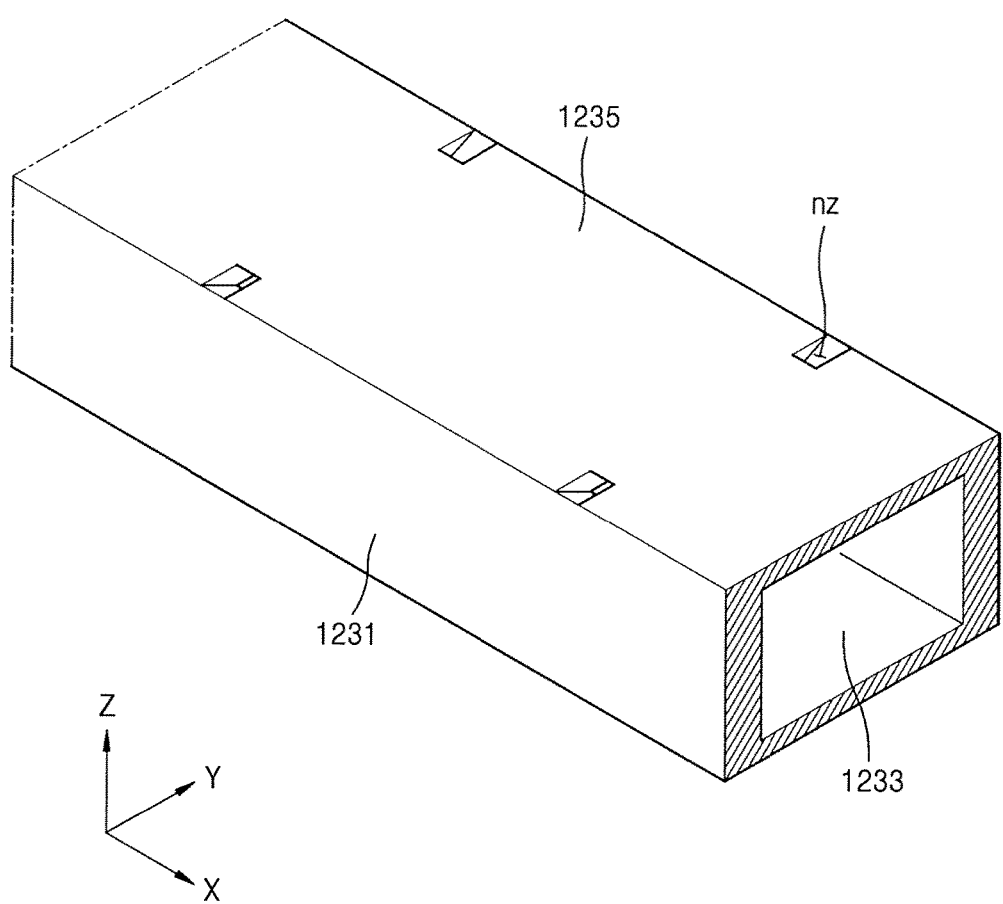

The nozzles nz may be open holes that are connected to the pipe structures 1230 and through which the fluids FL in the pipe structures 1230 are discharged to the outside. The nozzles nz may be formed in the second direction (the direction Y). Accordingly, the fluids FL discharged from the nozzles nz may be discharged in a lateral direction, for example, the second direction (the direction Y) in the drawings, to move away from a central portion of the pipe structures 1230. The pipe structures 1230 located at the outermost locations include the nozzles only at one side surface thereof. Other pipe structures 1230, for example, the inner pipe structures 1230 may include the nozzles nz at both side surfaces thereof, since two neighboring semiconductor modules are arranged at the both side surfaces thereof, each semiconductor module facing each side surface. For example, a pair of nozzles nz may be formed at both side surfaces of the inner pipe structures 1230. Here, the top ceiling 1235, which is in line with the pair of nozzles nz, may be open. However, the inventive concept is not limited thereto, and only the nozzle portion of the top ceiling 1235 may be open as illustrated in FIG. 13E. However, shapes of the nozzles nz are not limited thereto, and may vary so that a flow of the fluid FL discharged from the nozzles nz is appropriate for the test environment. For example, as illustrated in FIG. 13B, a nozzle nz1 may have a linear shape in the first direction (the direction X). Alternatively, as illustrated in FIG. 13C, a nozzle nz may have a section including an inflection point or an apex. Alternatively, as illustrated in FIG. 13D, a nozzle nz may have a section including a circle or an oval.

Figure 14A:
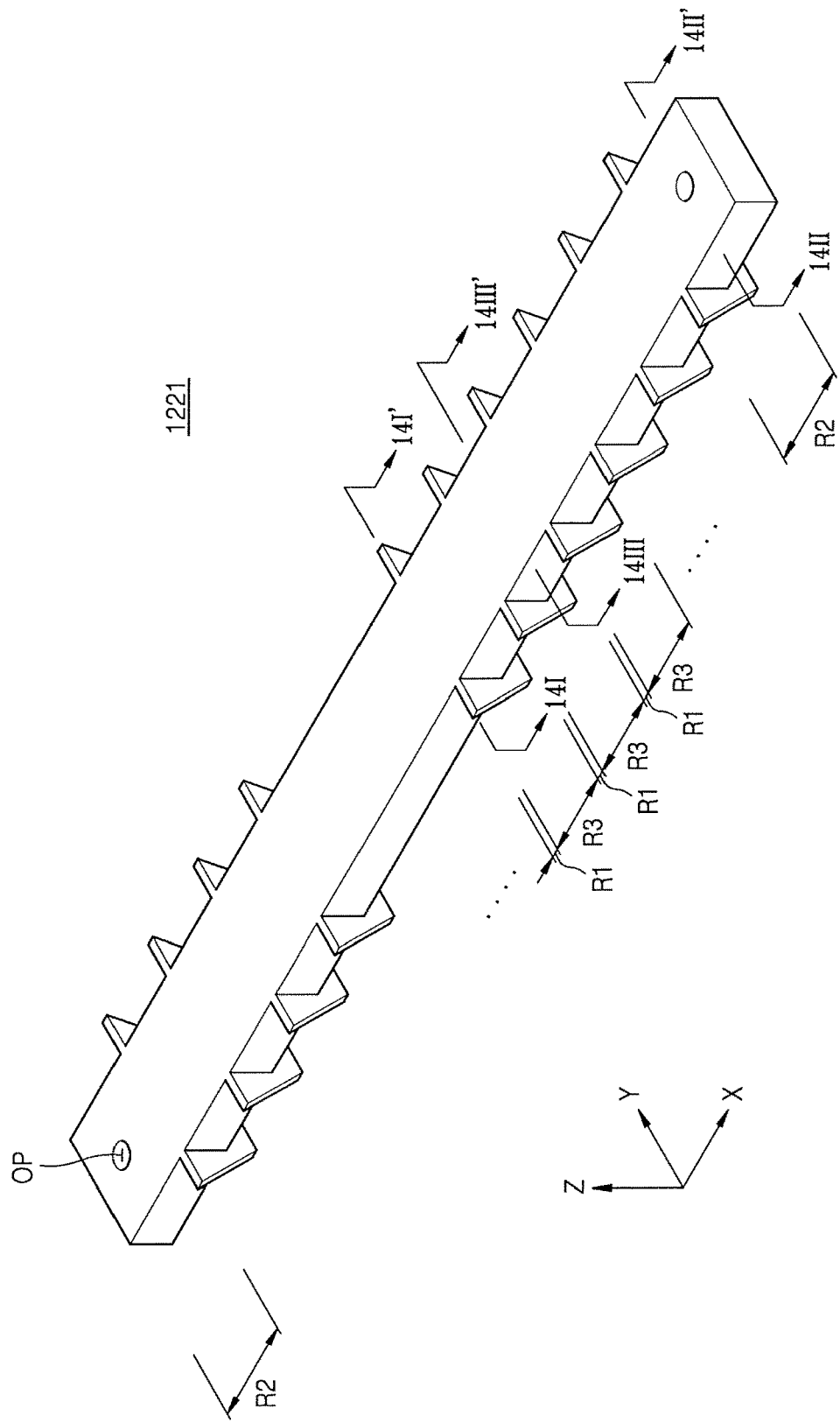
FIGS. 14A and 14B are, respectively, a perspective view and a top view illustrating a nozzle plug included in the semiconductor module testing equipment of FIG. 1, according to an exemplary embodiment of the inventive concept.
Figure 14B:
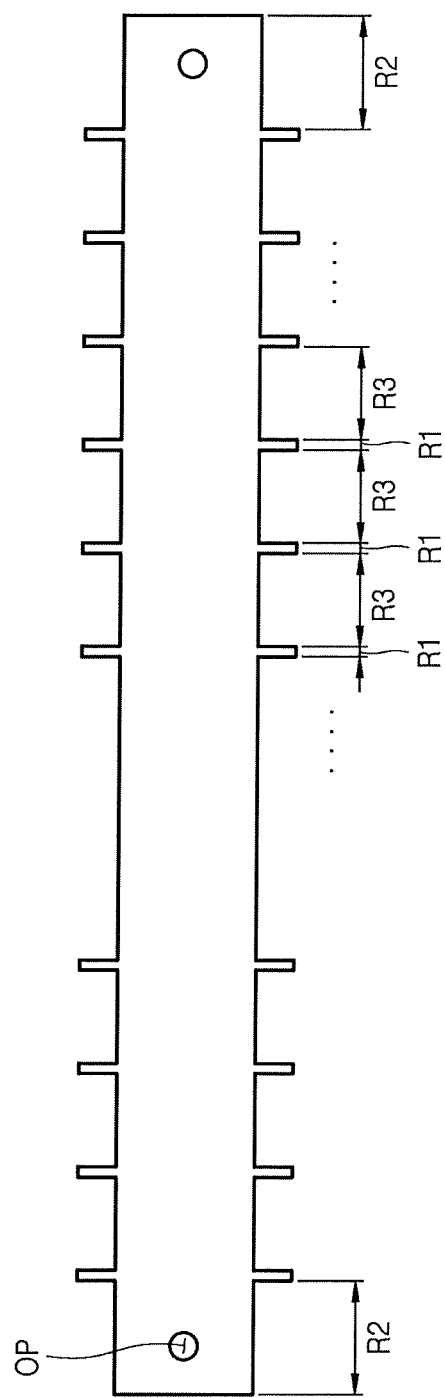
Figure 14C:
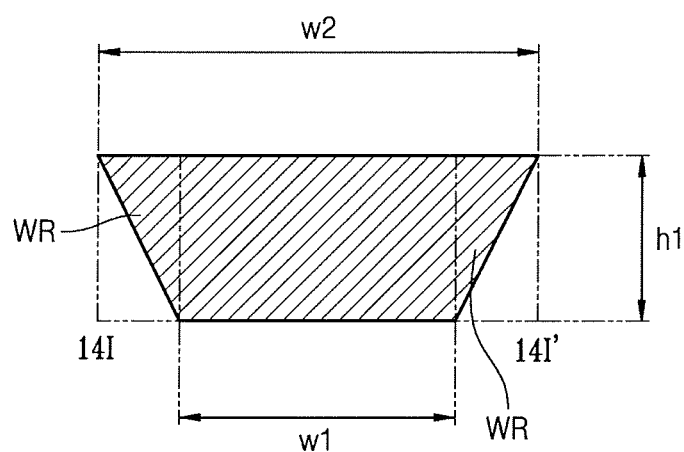
FIGS. 14C through 14E are cross-sectional views taken along lines 14I-14I', 14II-14II', and 14III-14III' of FIG. 14A, respectively, according to exemplary embodiments of the inventive concept.
Figure 14D:
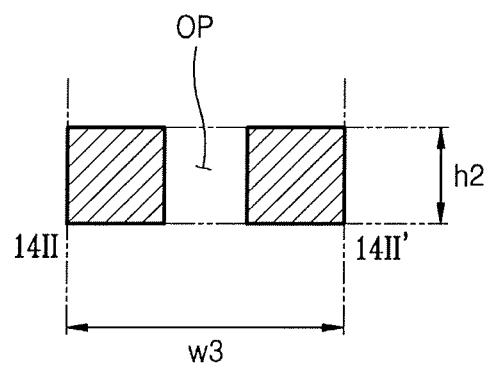
Figure 14E:
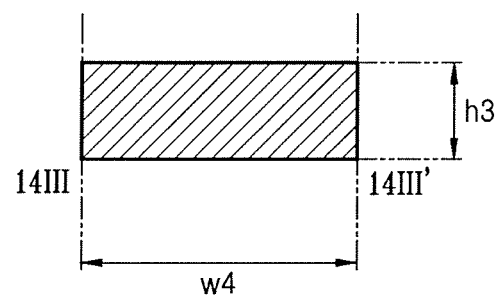
Figure 14F:
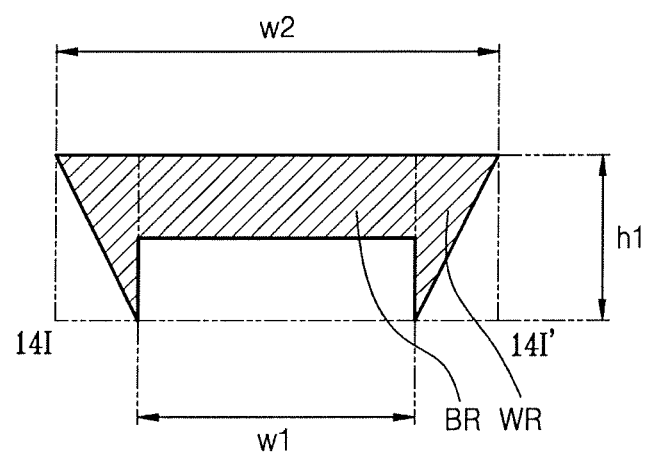
FIG. 14F is a cross-sectional view illustrating a nozzle plug included in the semiconductor module testing equipment of FIG. 1, according to an exemplary embodiment of the inventive concept.

FIGS. 14A and 14B are, respectively, a perspective view and a top view illustrating a nozzle plug included in the semiconductor module testing equipment of FIG. 1, according to an exemplary embodiment of the inventive concept. FIGS. 14C through 14E are cross-sectional views taken along lines 14I-14I', 14II-14II', and 14III-14III' of FIG. 14A, respectively, according to exemplary embodiments of the inventive concept. FIG. 14F is a cross-sectional view illustrating a nozzle plug included in the semiconductor module testing equipment of FIG. 1, according to an exemplary embodiment of the inventive concept. For example, the cross-sectional view illustrated in FIG. 14F may correspond to FIG. 14C.

Referring to FIGS. 14A through 14E, the nozzle plug 1221 may include open portions OP at both ends thereof in the first direction (the direction X). The open portions OP may extend in the first direction (the direction X) and the adjusting screws 1225 may be coupled to be adjacent to the open portions OP. The nozzle plug 1221 may include first areas R1 corresponding to nozzles nz, second areas R2 to which the adjusting screws 1225 are coupled, and third areas R3 which may be defined by the first areas R1 and the second areas R2 and arranged between the nozzles nz.

A section of the first areas R1 of the nozzle plug 1221 in the second direction (the direction Y) may have, for example, a ladder shape. Any one of two parallel sides of the ladder-shaped section may be adjacent to the pipe structures 1230. Alternatively, the two parallel sides of the ladder-shaped section may extend in the second direction. When a length of the side of the two parallel sides of the ladder-shaped section, which is farther apart from the nozzle than the other side, is a second length w2, and a length of the other side is a first length w1, the first length w1 may be less than the second length w2. The first areas R1 of the nozzle plug 1221 may have a first height h1 in a perpendicular direction, for example, the third direction (the direction Z). A length of the first areas R1 in the first direction (the direction X) may correspond to a size of the nozzle nz. When an area protruding from a rectangle defined by the first length w1 and the first height h1 is defined as a wing portion WR, the first areas R1 may have two wing portions WR. A sectional profile of the first areas R1, which is defined by values of the first length w1, the second length w2, and the first height h1, may correspond to a profile of the nozzle nz. As described above, the first areas R1 correspond to the nozzles nz, and one first area R1 corresponds to two nozzles nz disposed at opposite directions in the second direction (the direction Y). For example, when one pipe structure 1230 includes 2n (e.g., n is a positive integer) nozzles, the nozzle plugs 1221 may include n (e.g., n is a positive integer) first areas R1. As described above, the first areas R1 of the nozzle plugs 1221 may adjust the size or the profile of the nozzle nz. Thus, a length of the first areas R1 in the first direction (the direction X) may be substantially the same as a length of the nozzles nz in the first direction (the direction X).

The second areas R2 of the nozzle plug 1221 may be, for example, located at both ends of the nozzle plug 1221 in the first direction (the direction X). Sections of the second areas R2 in the second direction (the direction Y) may have, for example, shapes of a rectangle penetrated by the open portion OP or two rectangles separated by the open portion OP. Here, a length of the second areas R2 in the second direction (the direction Y) may be a third length w3. The third length w3 may be substantially less than the second length w2. Also, the third length w3 may be substantially the same as the first length w1. The second areas R2 of the nozzle plug 1221 may have a second height h2 in a perpendicular direction, for example, the third direction (the direction Z). Here, the second height h2 may be less than the first height h1.

The third areas R3 of the nozzle plug 1221 may be, for example, interposed between two neighboring first areas R1. Sections of the third areas R3 in the second direction (the direction Y) may have, for example, rectangular shapes. Here, a length of the third areas R3 in the second direction (the direction Y) may be a fourth length w4. The fourth length w4 may be substantially less than the second length w2. Also, the fourth length w4 may be substantially the same as the first length w1. Also, the fourth length w4 may be substantially the same as the third length w3. The third areas R3 of the nozzle plug 1221 may have a third height h3 in a perpendicular direction, for example, the third direction (the direction Z). The third height h3 may be less than the first height h1. Also, the third height h3 may be substantially the same as the second height h2.

FIG. 14F is a cross-sectional view of the first areas R1 according to an exemplary embodiment of the inventive concept and corresponds to FIG. 14C. Hereinafter, differences between FIG. 14F and FIG. 14C will be mainly described.

Referring to FIG. 14F, the wing portion WR of the first areas R1 may be substantially the same as the wing portion WR of FIG. 14C. The wing portion WR illustrated in FIG. 14F may be disposed adjacent to a sunk portion which is adjacent to a short side of the ladder shape. For example, the first areas R1 of the nozzle plug 1221 may include two wing portions WR having shapes of a right-angled triangle and a bridge portion BR connecting the two wing portions WR. An upper surface of the bridge portion BR and upper surfaces of the wing portions WR may be on the same level to form a coplanar area. Accordingly, all other areas of a pipe structure except the nozzles nz may be sealed by an upper ceiling, according to an exemplary embodiment of the inventive concept. The pipe structure, according to an exemplary embodiment of the inventive concept, may correspond to the pipe structures 1230 illustrated in FIG. 13E.

Figure 15A:
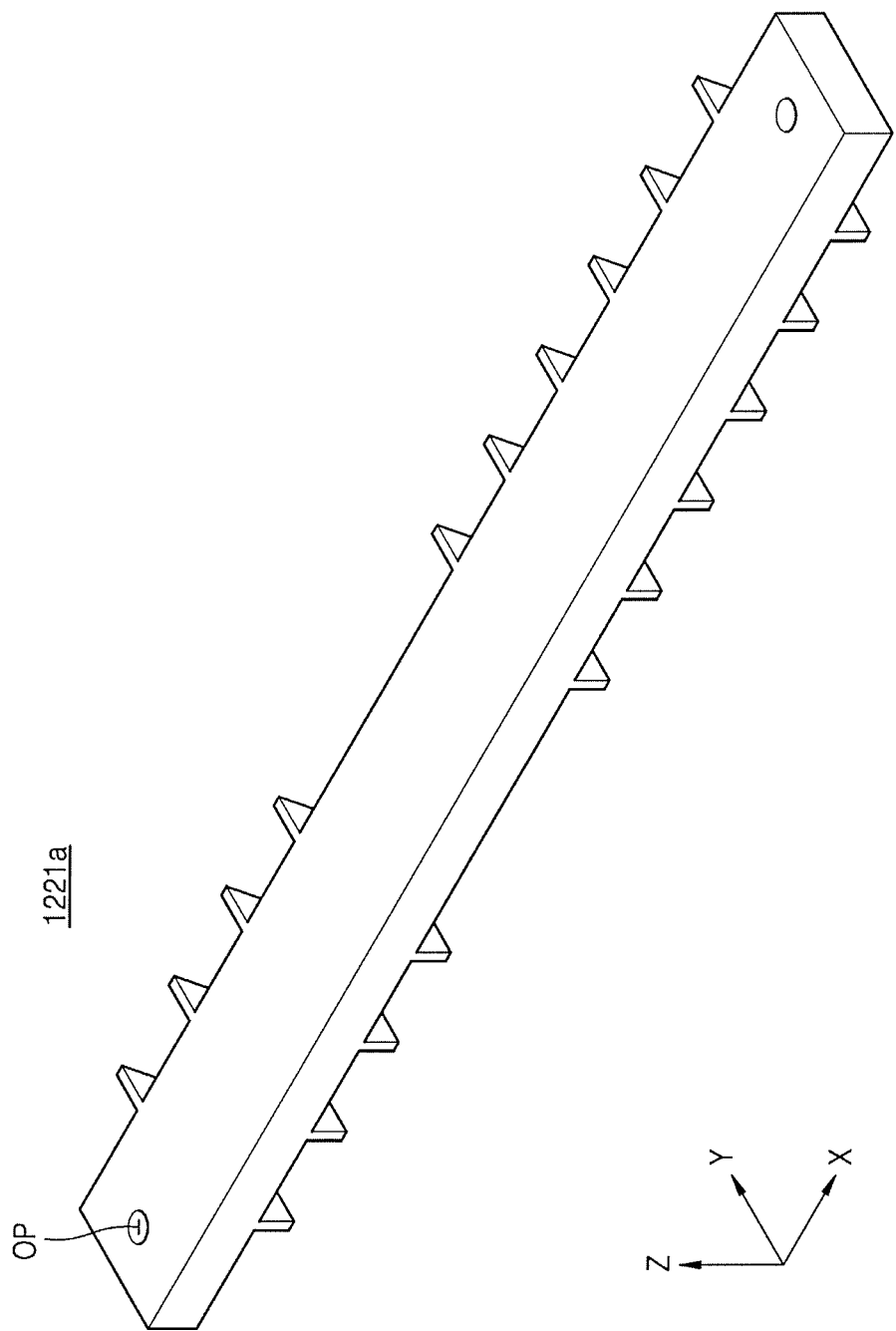
FIGS. 15A and 15B are perspective views illustrating nozzle plugs included in semiconductor module testing equipment of FIG. 1, according to exemplary embodiments of the inventive concept.
Figure 15B:
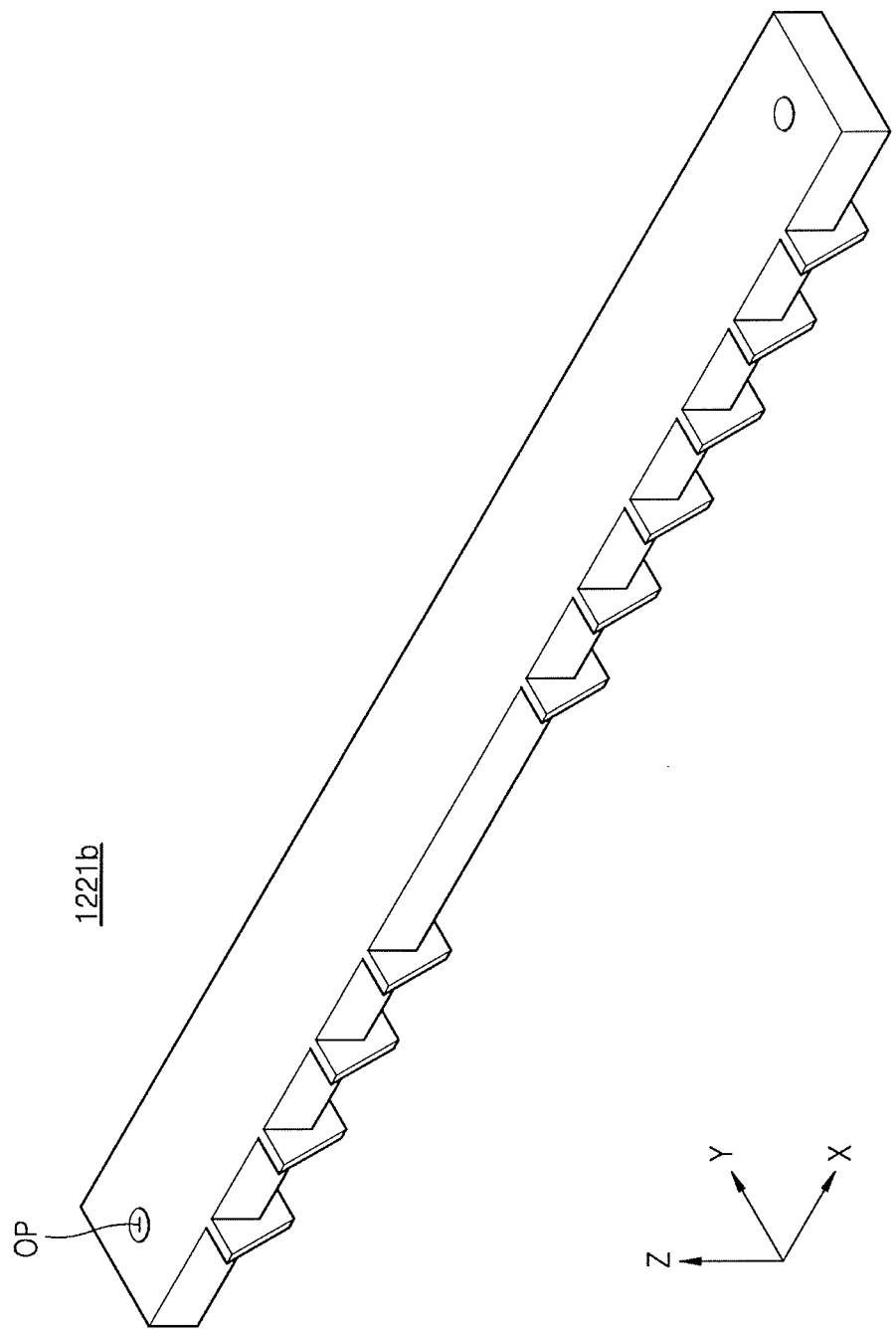

FIGS. 15A and 15B are perspective views illustrating two nozzle plugs 1221a and 1221b, respectively, included in semiconductor module testing equipment 1000 of FIG. 1, according to exemplary embodiments of the inventive concept.

Referring to FIGS. 15A and 15B, the two nozzle plugs 1221a and 1221b may be arranged at the outermost area, for example, at both ends of the second direction, may have different shapes from the nozzle plugs 1221 interposed between the two nozzle plugs 1221a and 1221b. For example, since the pipe structures 1230 arranged at the outermost areas include the nozzles nz at only one side surface thereof, correspondingly, the nozzle plugs 1221a and 1221b may include the wing portion WR at only one side surface thereof. For example, since the two pipe structures 1230 arranged at the outermost areas include the nozzles nz at the side surface facing the semiconductor module sockets 120, correspondingly, the nozzle plugs 1223 may include the wing portion WR only at the side surface facing the semiconductor module sockets 120. Planes of the nozzle plugs 1223 in the second direction and the third direction, for example, sections according to a y-z plane in the drawing, may have shapes of a ladder including three right angles. In some cases, the two nozzle plugs 1223 arranged at the both ends of the direction Y may have a mirror shape with respect to each other. For example, when the pipe structures 1230 corresponding to the nozzle plugs 1223 at the outermost areas include n (e.g., where n is a positive integer) nozzles, the nozzle plugs 1223 may include n (e.g., where n is a positive integer) first areas R1.

Figure 16:
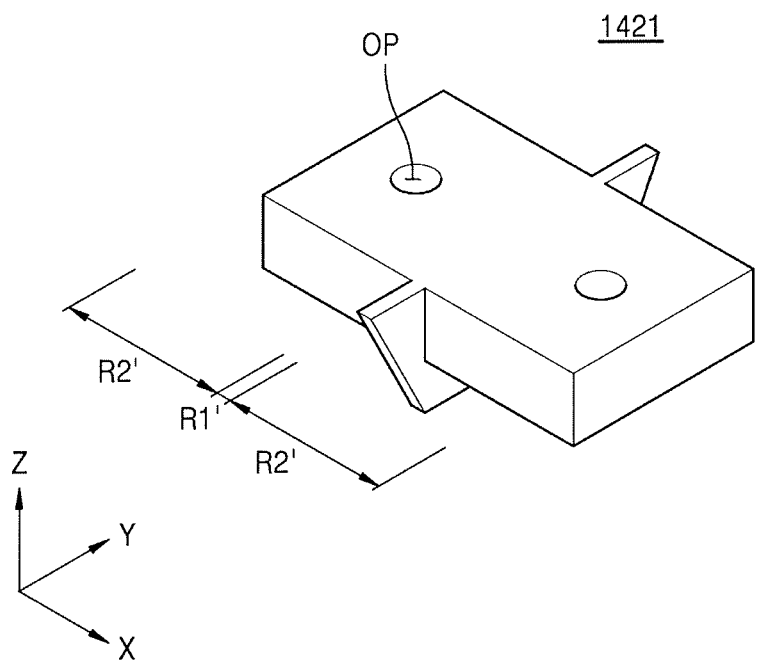
FIG. 16 is a perspective view illustrating a nozzle plug included in the semiconductor module testing equipment of FIG. 1, according to an exemplary embodiment of the inventive concept.

FIG. 16 is a perspective view illustrating a nozzle plug 1421 included in the semiconductor module testing equipment 1000 of FIG. 1, according to an exemplary embodiment of the inventive concept.

Referring to FIG. 16, the nozzle plug 1421 may include first areas R1 corresponding to nozzles nz and second areas R2 to which the adjusting screws 1225 are coupled. Here, the nozzle plug 1421 may include a pair of nozzles nz arranged at opposite sides in the second direction (the direction Y). In this case, one nozzle plug 1421 may correspond to one pair of nozzles nz. Thus, a size and a profile of one pair of nozzles nz may be separately adjusted. Accordingly, a heating and a cooling environment that is proper for a device heating characteristic may be provided. For example, as a distance between the nozzles nz and the fluid injection hole 1260 increases, a fluid FL pressure may decrease and a speed of a discharged fluid FL may decrease. Thus, the speed of the discharged fluid FL may be increased by reducing the size of the nozzles nz.

Figure 17:
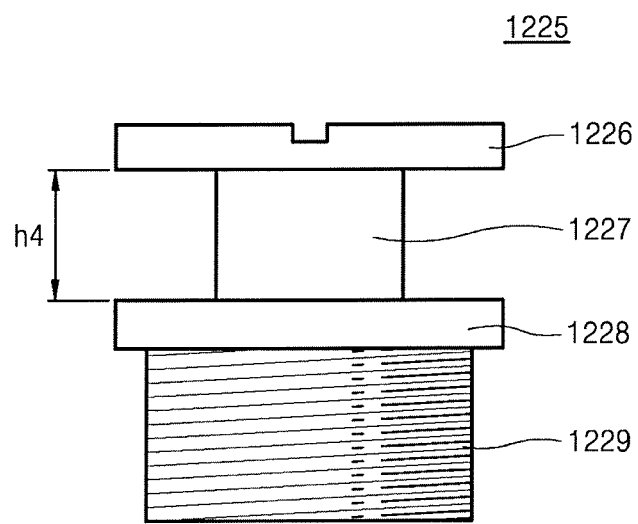
FIG. 17 is a cross-sectional view illustrating an adjusting screw included in the semiconductor module testing equipment of FIG. 1, according to an exemplary embodiment of the inventive concept.

FIG. 17 is a cross-sectional view illustrating an adjusting screw 1225 included in the semiconductor module testing equipment 1000 of FIG. 1, according to an exemplary embodiment of the inventive concept.

Referring to FIG. 17, the adjusting screw 1225 may include a top fixing portion 1226, a penetration portion 1227, a bottom fixing portion 1228, and a screw portion 1229. The penetration portion 1227 may be coupled to an open portion OP to penetrate the nozzle plugs 1221. The penetration portion 1227 may have a fourth height h4 in a perpendicular direction, where the third height h3 and the fourth height h4 may be substantially the same as each other.

The top fixing portion 1226 and the bottom fixing portion 1228 may be arranged at an upper end and a lower end of the open portion OP, respectively, so that the nozzle plugs 1221 may be fixed to the adjusting screw 1225 in the third direction (the direction Z). Also, the adjusting screw 1225 may rotate about an axis of the nozzle plugs 1221 in the third direction (the direction Z). The top fixing portion 1226 may include a groove, such as a cross groove or a linear groove, to adjust a height of the adjusting screw 1225 by using a screwdriver, etc. However, the inventive concept is not limited thereto.

The screw portion 1229 formed under a bottom surface of the bottom fixing portion 1228 may include a spiral shape. When the adjusting screw 1225 rotates, the screw portion 1229 may descend according to a spiral grove formed in a body portion of the adjusting screw 1225 to lift or lower the nozzle plugs 1221. Accordingly, the size or profile of the nozzles nz may be adjusted.

The screw-shaped member for upward and downward adjustment has been described as the component for lifting or lowering the nozzle plugs 1221. However, the inventive concept is not limited thereto. For example, an adjusting member using a fluid FL pressure, an adjusting member using a magnetic field, an adjusting member using an electric field, or an adjusting member applying detachable mechanical coupling, such as deterrence coupling, insertion coupling, coupling based on elasticity, etc., may be used to adjust the flow of the fluid FL from the nozzles nz toward the semiconductor modules 300.

Figure 18:
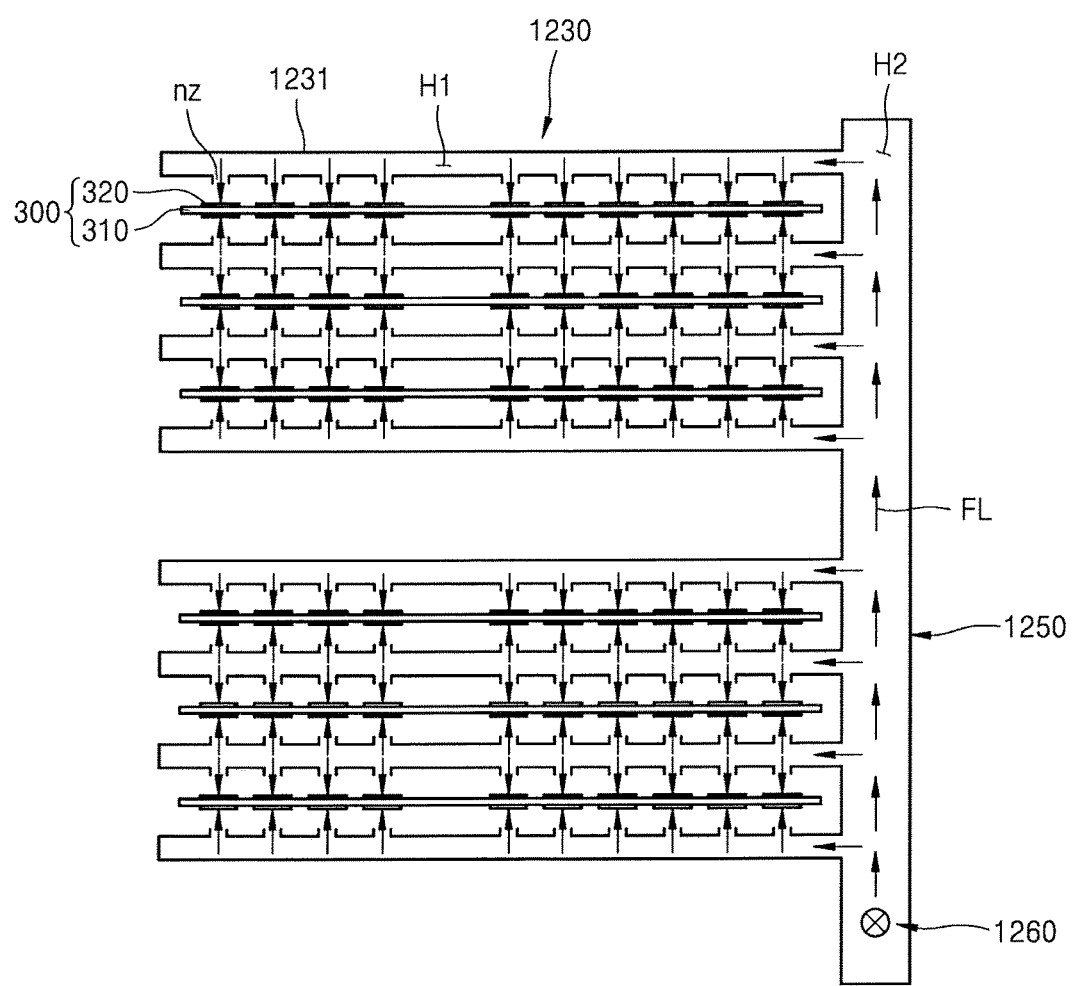
FIG. 18 is a schematic view illustrating the flow of a heating or a cooling fluid according to an exemplary embodiment of the inventive concept.

FIG. 18 is a schematic view illustrating the flow of a cooling or a heating fluid FL according to an exemplary embodiment of the inventive concept. In FIG. 18, the fluid injection hole 1260, the fluid distributor 1250, the pipe structures 1230, and the semiconductor modules 300 are schematically illustrated for convenience of description.

Referring to FIG. 18, the cooling or the heating fluid FL injected to the fluid injection hole 1260 may flow along the fluid distributor 1250 to be injected into the pipe structures 1230. Arrows indicate the flow of the fluid FL. The cooling and the heating fluids FL may be discharged toward the memory modules through the nozzles nz, connected to each of the pipe structures 1230. In some cases, the nozzles nz and the semiconductor stacks 320 may be matched to each other in a one-to-one correspondence in which each semiconductor stack 320 included in the semiconductor modules 300 corresponds to one selected from the nozzles nz. However, the inventive concept is not limited thereto, and the number of nozzles nz may be more or less than the number of semiconductor stacks 320. Based on the one-to-one correspondence, in which one nozzle nz corresponds to one semiconductor stack 320, the heating/cooling efficiency and reliability may be increased. According to the inventive concept, the heating and the cooling fluids FL are directly injected onto the semiconductor stacks 320. Thus, even if a temperature difference is generated due to an operational difference among the semiconductor stacks 320, the heating and the cooling fluids FL may be sufficiently provided to each of the semiconductor stacks 320.

Figure 19A:
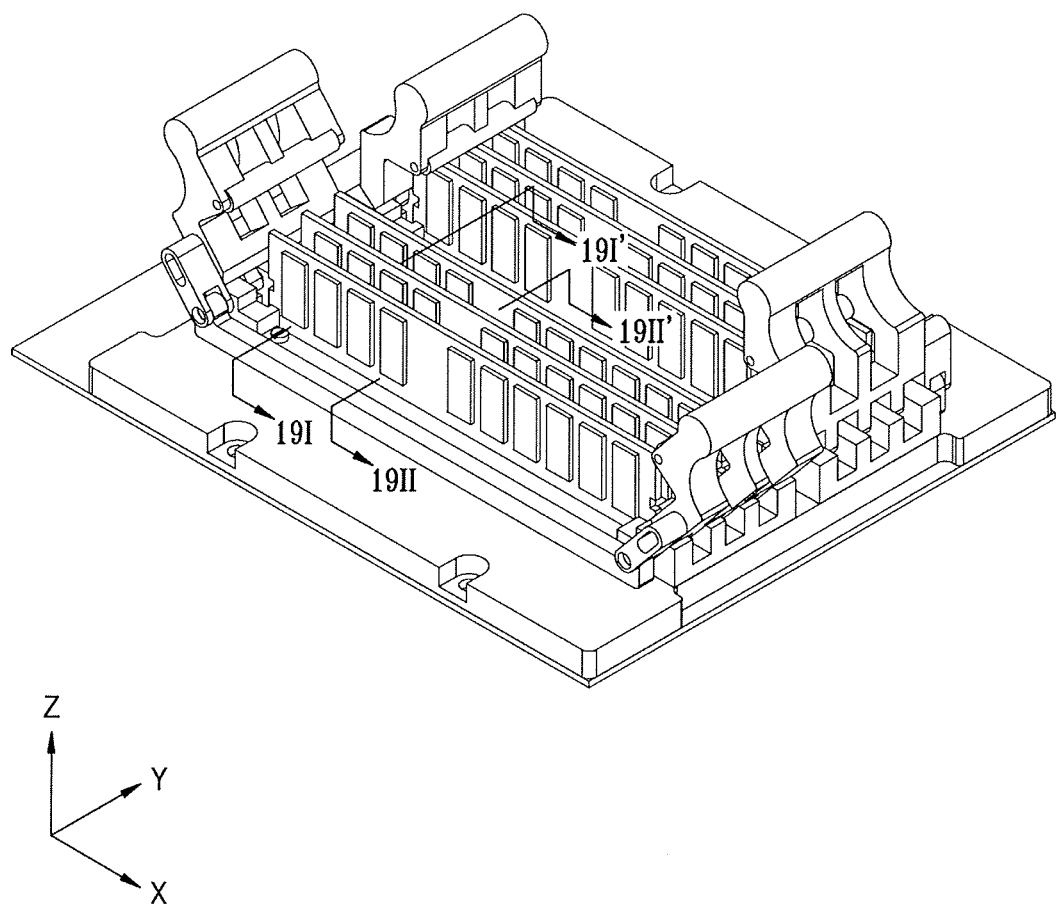
FIG. 19A is a perspective view illustrating the semiconductor module testing equipment of FIG. 1, according to an exemplary embodiment of the inventive concept.
Figure 19B:
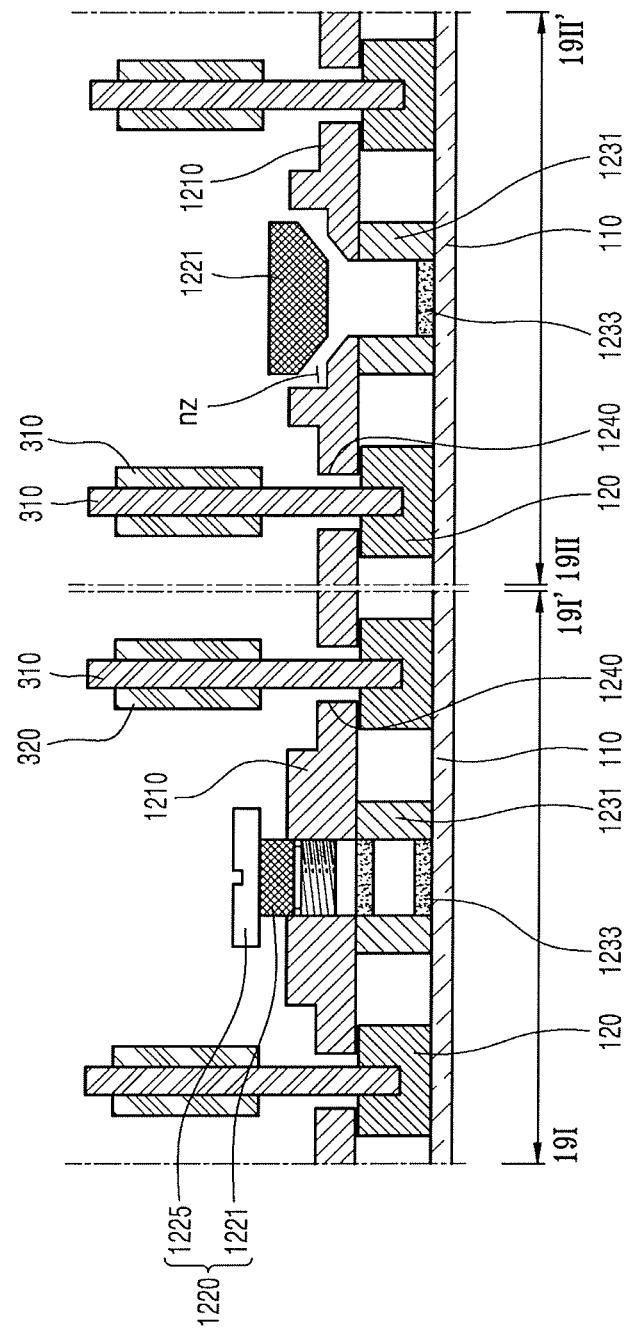
FIGS. 19B and 19C are cross-sectional views respectively taken along lines 19I-19I' and 19II-19II' of FIG. 19A, according to exemplary embodiments of the inventive concept.
Figure 19C:
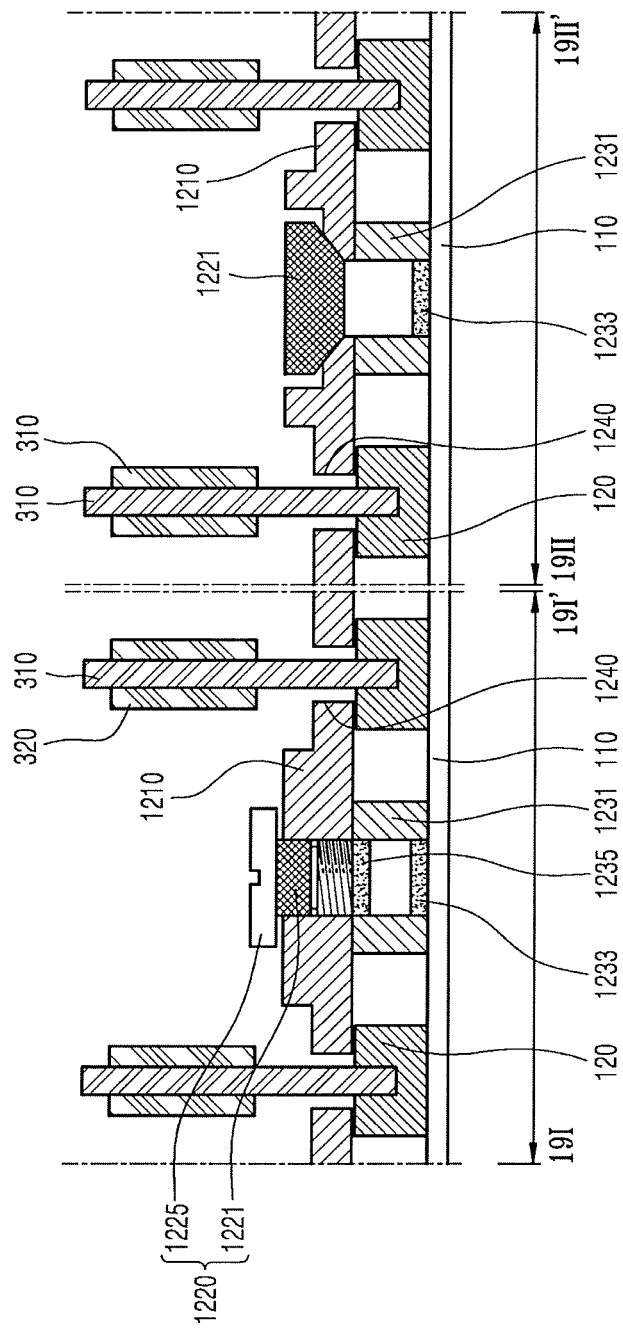

FIG. 19A is a perspective view illustrating a semiconductor module testing equipment 1000" of FIG. 1, according to an exemplary embodiment of the inventive concept. FIGS. 19B and 19C are cross-sectional views respectively taken along lines 19I-19I' and 19II-19II' of FIG. 19A, according to exemplary embodiments of the inventive concept. FIGS. 19B and 19C may be used to describe the nozzle nz manipulation of the semiconductor module testing equipment 1000" of FIG. 19A. FIGS. 19B and 19C describe different opening degrees of the nozzles nz.

Referring to FIG. 19A, the top plate 200 may be coupled on the test board 100 and the semiconductor modules 300 may be inserted into the semiconductor module sockets 120.

Referring to FIG. 19B, the adjusting member 1220 ascends to the highest level so that the nozzles nz are completely open. Accordingly, the amount of a fluid FL discharged from the nozzles nz may be maximized.

Referring to FIG. 19C, the adjusting member 1220 descends to the lowest level. When the adjusting screw 1225 descends along a screw groove formed in the body thereof, the nozzle plugs, fixed to the adjusting screw 1225 with respect to an upward and downward direction, may also descend. Accordingly, the nozzles nz may be completely closed, and fluids FL supplied to the pipe structures 1230 are not discharged to the neighboring semiconductor stacks 320.

Alternatively, the adjusting member 1220 may descend compared to FIG. 19B and may ascend compared to FIG. 19C. For example, the nozzles nz may be partially open. In this case, sizes of the nozzles nz may be less than the case of FIG. 19B. Thus, the flow speed of the discharged fluid FL may be greater than the case of FIG. 19B. Alternatively, the orientation angle of the discharged fluid FL may be greater compared to the case of FIG. 19B.

While the inventive concept has been particularly shown and described with reference to exemplary embodiments thereof, it will be apparent to those of ordinary skill in the art that various changes in form and detail may be made therein without departing from the spirit and scope of the inventive concept.

What is claimed is:

1. Semiconductor module testing equipment, comprising:
   a test board;
   a plurality of pipe structures disposed directly on an upper surface of the test board in a first direction and spaced apart from one another in a second direction that intersects the first direction, wherein the first and second directions are substantially parallel to a plane of the test board;
   a plurality of semiconductor module sockets disposed between a pair of neighboring pipe structures of the plurality of pipe structures,
   wherein each of the plurality of semiconductor module sockets is configured to receive a corresponding semiconductor module board therein; and
   a plurality of nozzles disposed on each pipe structure of the plurality of pipe structures, wherein the plurality of nozzles is configured to discharge a fluid in a lateral direction with respect to a central axis of the plurality of pipe structures, wherein the central axis being parallel to the first direction.

2. The semiconductor module testing equipment of claim 1, wherein the plurality of semiconductor module sockets and the plurality of pipe structures are alternately disposed.

3. The semiconductor module testing equipment of claim 1,
   wherein each semiconductor module socket of the plurality of semiconductor module sockets extends in the first direction.

4. The semiconductor module testing equipment of claim 1,
   wherein the plurality of pipe structures comprises a first pipe structure, a second pipe structure and a third pipe structure that is disposed between the first and second pipe structures, wherein the third pipe structures comprise a first nozzle array and a second nozzle array spaced apart from one another in the first direction, wherein the first nozzle array and the second nozzle array are substantially parallel to each other and spaced apart from each other in the second direction, and wherein each of the first nozzle array and the second nozzle array corresponds to a respective adjacent semiconductor module socket of the plurality of semiconductor module sockets.

5. The semiconductor module testing equipment of claim 4, wherein each of the first and second pipe structures comprises a third nozzle array, wherein the third nozzle array of the first pipe structure and the third nozzle array of the second pipe structure, respectively, corresponds to a respective adjacent semiconductor module socket of the plurality of semiconductor module sockets.

6. The semiconductor module testing equipment of claim 1, wherein the at least one semiconductor module socket is configured to mount a semiconductor module, the semiconductor module extending in the first direction and comprising at least one semiconductor stack, wherein at least one nozzle of the plurality of nozzles is configured to discharge the fluid toward the at least one semiconductor stack after the semiconductor module is mounted.

7. The semiconductor module testing equipment of claim 6, wherein the semiconductor module comprises a dual in-line memory module (DIMM).

8. The semiconductor module testing equipment of claim 6, wherein each semiconductor socket of the plurality of semiconductor sockets is configured to mount a semiconductor module, and each semiconductor module includes a first semiconductor stack, wherein each nozzle of the plurality of nozzles is configured to discharge the fluid toward one respective first semiconductor stack.

9. The semiconductor module testing equipment of claim 6, wherein the semiconductor module comprises a first semiconductor stack and a second semiconductor stack, wherein a center of the first semiconductor stack is spaced apart from a center of the second semiconductor stack is by a first distance, wherein a distance in the first direction between a first nozzle of the plurality of nozzles and a second nozzle of the plurality of nozzles is equal to the first distance, and wherein the first nozzle is configured to discharge the fluid toward the first semiconductor stack and the second nozzle is configured to discharge the fluid toward the second semiconductor stack.

10. A pipe structure, comprising:
a pair of curved end portions elevated with respect to, a test board;
a flat center portion disposed between the pair of curved end portions and disposed directly on the test board;
at least one nozzle array comprising a plurality of nozzles configured to discharge a fluid laterally,
wherein the pipe structure is disposed between a pair of neighboring semiconductor module sockets of a plurality of semiconductor module sockets, wherein the pair of neighboring semiconductor module sockets of the plurality of semiconductor module sockets is disposed on the test board and extends in a first direction, or wherein the pipe structure is disposed adjacent to a side of an outermost semiconductor module sockets of the plurality of semiconductor module sockets, and wherein the pipe structure comprises a first sub-pipe structure corresponding to a portion from central portions of the plurality of semiconductor module sockets to ends of the plurality of semiconductor module sockets and a second sub-pipe structure corresponding to portion from the central portions of the plurality of semiconductor module sockets to the other ends of the plurality of semiconductor module sockets.

11. The pipe structure of claim 10, wherein the pipe structure is disposed on the test board and extends in the first direction.

12. The pipe structure of claim 10, further comprising a plurality of pipe structures, wherein the plurality of semiconductor module sockets and the plurality of pipe structures are alternately arranged, and at least one pipe structure of the plurality of pipe structures is disposed at an outermost portion of the test board.

13. The pipe structure of claim 10, wherein the pipe structure comprises
a first array and a second nozzle array each comprising a plurality of nozzles.

14. The pipe structure of claim 13, wherein the first nozzle array is configured to discharge the fluid toward a first semiconductor module socket of the plurality of semiconductor module sockets that is adjacent to the first nozzle array, and the second nozzle array is configured to discharge the fluid toward a second semiconductor module socket of the plurality of semiconductor module sockets that is adjacent to the second nozzle array.

15. Semiconductor module testing equipment, comprising:
a board;
a first semiconductor module disposed on the board, the first semiconductor module comprising a plurality of semiconductor stacks disposed on a first side of the first semiconductor module and arranged in a first direction; and
a first pipe structure disposed directly on an upper surface of the board adjacent to the first side of the first semiconductor module, the first pipe structure extending in the first direction;
wherein the first pipe structure includes a plurality of holes, and
wherein each of the plurality of holes of the first pipe structure is configured to discharge a heating fluid or a cooling fluid toward the plurality of semiconductor stacks of the first side of the first semiconductor module to heat or cool the plurality of semiconductor stacks of the first side of the first semiconductor module.

16. The semiconductor module testing equipment of claim 15, further comprising a second pipe structure extending in the first direction, wherein the first semiconductor module further comprises a plurality of semiconductor stacks disposed on a second side of the first semiconductor module in the first direction, wherein the first and second sides of the first semiconductor module are opposite to each other, wherein the second pipe structure includes a plurality of holes disposed on a first side of the second pipe structure, wherein the first side of the second pipe structure faces the second side of the first semiconductor module, and wherein the plurality of holes of the first side of the second pipe structure are configured to discharge the heating fluid or the cooling fluid toward the plurality of semiconductor stacks of the second side of the first semiconductor module to heat or cool the plurality of semiconductor stacks of the second side of the first semiconductor module.

17. The semiconductor module testing equipment of claim 16, wherein the each of the first and second pipe structures is spaced apart from the first semiconductor module in a second direction crossing the first direction, and wherein the plurality of holes of the first pipe structure and the plurality of holes of the first side of the second pipe structure are configured to discharge the heating or the cooling fluid in the second direction.

18. The semiconductor module testing equipment of claim 16, further comprising a second semiconductor module extending in the first direction, the second semiconductor module comprising a plurality of semiconductor stacks disposed on a first side of the second semiconductor module in the first direction,
wherein the second pipe structure includes a plurality of holes disposed on a second side of the second pipe structure, the first and second sides of the second pipe structure being opposite to each other,
wherein the plurality of holes disposed on the second side of the second pipe structure are configured to discharge the heating fluid or the cooling fluid to the plurality of semiconductor stacks disposed on the first side of the second semiconductor module to heat or cool the plurality of semiconductor stacks disposed on the first side of the second semiconductor module.

19. The semiconductor module testing equipment of claim 15, further comprising a temperature controller configured to provide the heating fluid or the cooling fluid; and
a fluid supply channel configured to connect the temperature controller with the first pipe structure to supply the first pipe structure with the heating fluid or the cooling fluid.

20. The semiconductor module testing equipment of claim 15, further comprising:
a top plate disposed on the test board;
wherein the first pipe structure has a center portion disposed directly on the test board and extending in the first direction, and a bent second portion disposed on an end of the first portion and extending at least partially in a direction substantially perpendicular to the surface of the board,
wherein the top plate has at least one pair of fixing handles for securing the semiconductor module, and further includes bridge portions with gaps formed between adjacent bridge portions.

* * * * *